US011157316B1

(12) United States Patent
Li et al.

(10) Patent No.: US 11,157,316 B1
(45) Date of Patent: Oct. 26, 2021

(54) DETERMINING ACTION SELECTION POLICIES OF AN EXECUTION DEVICE

(71) Applicant: ALIPAY (HANGZHOU) INFORMATION TECHNOLOGY CO., LTD., Zhejiang (CN)

(72) Inventors: Hui Li, Hangzhou (CN); Le Song, Hangzhou (CN)

(73) Assignee: Alipay (Hangzhou) Information Technology Co., Ltd., Zhejiang (CN)

( * ) Notice: Subject to any disclaimer, the term of this patent is extended or adjusted under 35 U.S.C. 154(b) by 0 days.

(21) Appl. No.: 17/219,402

(22) Filed: Mar. 31, 2021

Related U.S. Application Data

(63) Continuation of application No. PCT/CN2020/082909, filed on Apr. 2, 2020.

(51) Int. Cl.
*G06F 9/46* (2006.01)
*G06F 9/48* (2006.01)
(Continued)

(52) U.S. Cl.
CPC ........... *G06F 9/4881* (2013.01); *B60W 60/00* (2020.02); *G06F 9/4843* (2013.01); *G06F 9/528* (2013.01); *G06K 9/6257* (2013.01); *G06K 9/6277* (2013.01); *G06N 3/02* (2013.01); *G06N 3/08* (2013.01); *G05B 2219/25255* (2013.01)

(58) Field of Classification Search
CPC ...... G06F 9/4881; G06F 9/4843; G06F 9/528; B60W 60/00; G06K 9/6257; G06K 9/6277; G06N 3/02; G06N 3/08; G05B 2219/25255
See application file for complete search history.

(56) References Cited

U.S. PATENT DOCUMENTS

| 10,678,125 B2 | 6/2020 | Li et al. |
| 2014/0039913 A1 | 2/2014 | Sandholm |

(Continued)

FOREIGN PATENT DOCUMENTS

| CN | 106296006 | 1/2017 |
| CN | 109101339 | 12/2018 |

(Continued)

OTHER PUBLICATIONS

U.S. Appl. No. 17/219,038, filed Mar. 31, 2021, Li et al.
(Continued)

*Primary Examiner* — Gregory A Kessler
(74) *Attorney, Agent, or Firm* — Fish & Richardson P.C.

(57) ABSTRACT

Computer-implemented methods, systems, and apparatus, including computer-readable medium, for generating an action selection policy for causing an execution device to complete a task are described. Data representing a task that is divided into a sequence of subtasks are obtained. For a specified subtask except for a first subtask in the sequence of subtasks, a value neural network (VNN) is trained. The VNN receives inputs include reach probabilities of reaching a subtask initial state of the specified subtask, and predicts a reward of the execution device in the subtask initial state of the specified subtask. A strategy neural network (SNN) for a prior subtask that precedes the specified subtask is trained based on the VNN. The SNN receives inputs include a sequence of actions that reach a subtask state of the prior subtask, and predicts an action selection policy of the execution device in the subtask state of the prior subtask.

20 Claims, 8 Drawing Sheets

(51) Int. Cl.
    *G06N 3/08*    (2006.01)
    *G06K 9/62*    (2006.01)
    *B60W 60/00*   (2020.01)
    *G06F 9/52*    (2006.01)
    *G06N 3/02*    (2006.01)

(56) References Cited

U.S. PATENT DOCUMENTS

| | | |
|---|---|---|
| 2016/0260024 A1 | 9/2016 | Campos et al. |
| 2017/0257452 A1 | 9/2017 | Hoiles et al. |
| 2018/0098330 A1 | 4/2018 | Nguyen et al. |
| 2018/0357554 A1 | 12/2018 | Hazan et al. |
| 2019/0332922 A1 | 10/2019 | Nachum et al. |
| 2019/0354813 A1 | 11/2019 | Riedmiller et al. |

FOREIGN PATENT DOCUMENTS

| | | |
|---|---|---|
| CN | 110170171 | 8/2019 |
| CN | 110489223 | 11/2019 |
| CN | 110882544 | 3/2020 |
| RU | 2459254 | 8/2012 |

OTHER PUBLICATIONS

Brown et al., "Deep counterfactual regret minimization," arXiv preprint arXiv:1811.00164, Nov. 13, 2018, pp. 1-12.
Chen et al., "Utilizing History Information in Acquiring Strategies for Board Game Geister by Deep Counterfactual Regret Minimization," The 24th Game Programming Workshop, 2019, pp. 20-27.
Crosby et al., "BlockChain Technology: Beyond Bitcoin," Sutardja Center for Entrepreneurship & Technology Technical Report, Oct. 16, 2015, 35 pages.
Davis et al., "Low-Variance and Zero-Variance Baselines for Extensive-Form Games," arXiv:1907.09633v1, Jul. 2019, 21 pages.
European Search Report in European Application No. 19789849.7 dated Jan. 8, 2020, 8 pages.
Gibson et al., "Efficient Monte Carlo Counterfactual Regret Minimization in Games with Many Player Actions," Department of Computing Science, University of Alberta, NIPS'12 Proceedings of the 25th International Conference on Neural Information Processing Systems, 2012, 9 pages.
Hu et al., "Online Counterfactual Regret Minimization in Repeated Imperfect Information Extensive Games," Journal of Computer Research and Development, 2014, 51(10): 2160-2170 (with English Abstract).
Johanson et al., "Efficient Nash Equilibrium Approximation through Monte Carlo Counterfacutal Regret Minimization," Conference: Autonomous Agents and Multiagent Systems, May 2012, 8 pages.
Johanson et al., zinkevich.org [online], "Accelerating Best Response Calculation in Large Extensive Games," Jul. 2011, retrieved on Feb. 14, 2020, retrieved from URL<http://martin.zinkevich.org/publications/ijcai2011_rgbr.pdf, 8 pages.
Lanctot et al., "Monte Carlo Sampling for Regret Minimization in Extensive Games," Advances in Neural Information Processing Systems, 2009, 4 pages.
Li et al., "Double Neural Counterfactual Regret Minimization," Georgia Institute of Technology, 2018, pp. 1-20.
Lisy et al, "Online Monte Carlo Counterfactual Regret Minimization for Search in Imperfect Information Games," International Conference on Autonomous Agents and Multiagent Systems, May 2015, pp. 27-36.
Liu et al., "A Game Theoretic Approach for Attack Prediction," Department of Information Systems, UMBC, 2002, 20 pages.
Miyagi et al., "An Analysis of Route Choice Behavior by a Regret Matching Model—Atomic Model With Imperfect Travel Information," Civil Engineering Planning Research and Treatises, Sep. 2010, 27(3):531-538 (with English abstract).
Moravcik et al., "Deep Stack: Expert-evel artificial intelligence in Heads-up no-limit poker," Science, May 2017, 356(6337):1-12.
Nakamoto, "Bitcoin: A Peer-to-Peer Electronic Cash System," www.bitcoin.org, 2005, 9 pages.
Neller et al., "Approximating Optimal Dudo Play with Fixed-Strategy Iteration Counterfacutal Regret Minimization," Advances in Computer Games: 13th International Conference, Jan. 2012, 14 pages.
Okumura, slideshare.net [online], "Latest trends in Poker AI," Oct. 31, 2017, retrieved on Feb. 22, 2021, retrieved from URL<https://www.slideshare.net/juneokumura/ai-20171031>, 22 pages.
PCT International Search Report and Written Opinion in International Application No. PCT/CN2019/072204, dated Oct. 15, 2019, 7 pages.
PCT International Search Report and Written Opinion in International Application No. PCT/CN2020/082909, dated Dec. 30, 2020, 8 pages.
PCT International Search Report and Written Opinion in International Application No. PCT/CN2020/082914, dated Jan. 4, 2021, 8 pages.
Schmid et al., "Variance Reduction in Monte Carlo Counterfactual Regret Minimization (VR-MCCFR_ for Extensive Form Games using Baselines," arXiv:1809.03057v1, Sep. 2018, 13 pages.
Teng, "Research on Texas Poker Game Based on Counterfactual Regret Minimization Algorithm," China Masters' Theses Full-text Database, Dec. 2015, 65 pages (with English Abstract).
Zheng et al., "Clustering routing algorithm of wireless sensor networks based on Bayesian game," Journal of Systems Engineering and Electronics, 2012, 23(1):154-159.
Zhou et al., "Lazy-CFR: a fast regret minimization algorithm for extensive games with Imperfect Information," Cornell University, 2018, arXiv:1810.04433v2, 10 pages.
Zinkevich et al., "Regret Minimization in Games with Incomplete Information," Neural Information Processing Systems, 2007, 14 pages.

DETERMINING ACTION SELECTION POLICIES OF AN EXECUTION DEVICE

CROSS-REFERENCE TO RELATED APPLICATIONS

This application is a continuation of PCT Application No. PCT/CN2020/082909, filed on Apr. 2, 2020, which is hereby incorporated by reference in its entirety.

TECHNICAL FIELD

This specification relates to determining action selection policies for an execution device for completing a task in an environment that includes the execution device and one or more other devices.

BACKGROUND

Real-world scenarios, such as autonomous vehicle (AV) control, resource allocation, traffic routing and control, product/service recommendation, cyber-attack prediction and/or prevention, fraud management, trading, bidding trading, and public auction, can be modeled, represented and simulated by strategic interaction between two or more parties (also referred to as players) in a game. For example, these real-life scenarios can be represented as an Imperfect Information Game (IIG) that involves two or more players, where a player only has partial access to the knowledge of her opponents before making a decision. Due to the hidden information, a player has to make decisions with uncertainty about her opponents' information, and she also needs to act so as to take advantage of her opponents' uncertainty about her own information.

In some instances, computer simulations for solving an IIG that present a real-life scenario can help find a useful solution to the real-life scenario. Solving an IIG can be computationally expensive and time consuming, especially for large games that have a large number of possible states and possible actions to choose that represent complex real-life scenarios that involve different environmental conditions and decision makings. For example, a large or very-large-scale (VLS) IIG can present a complex autonomous vehicle scenario that involves a large number of vehicles in a complex geographic area with different road, weather, and traffic conditions, and various control actions such as directions and speeds of the vehicles. Finding an optimal solution to the large IIG can require a substantial amount of computational resources in terms of computation time, processing power, and storage space. Techniques for solving a large or VLS IIG in an efficient manner are desirable, especially for real time applications.

SUMMARY

Described embodiments of the subject matter can include one or more features, alone or in combination.

For example, in one embodiment, a computer-implemented method for generating an action selection policy for causing an execution device to complete a task in an environment that includes the execution device and one or more other devices, the method comprising: obtaining data representing a task that is divided into a sequence of subtasks, wherein the task comprises a task initial state, a plurality of non-task-terminal states, and a plurality of task terminal states, wherein each of the task terminal states results from a sequence of actions taken by the execution device and by the one or more other devices in a subset of the plurality of non-task-terminal states, and the plurality of the task terminal states have respective rewards in the task terminal states, each subtask in the sequence of subtasks comprises one or more subtask initial states and a plurality of subtask terminal states of the subtask, and except for a last subtask in the sequence of subtasks, the plurality of subtask terminal states of the subtask are a plurality of subtask initial states of a next subtask that follows the subtask in the sequence of subtasks, for a specified subtask in the sequence of subtasks except for a first subtask in the sequence of subtasks, training a value neural network (VNN) for the specified subtask, wherein the VNN for the specified subtask receives inputs comprising reach probabilities of the execution device and the one or more other devices reaching a subtask initial state of the specified subtask, and predicts a reward of the execution device in the subtask initial state of the specified subtask; and training a strategy neural network (SNN) for a prior subtask that precedes the specified subtask in the sequence of the subtasks based on the VNN for the specified subtask, wherein the SNN for the prior subtask receives inputs comprising a sequence of actions taken by the execution device and by the one or more other devices that reach a subtask state of the prior subtask, and predicts an action selection policy of the execution device in the subtask state of the prior subtask.

In some embodiments, these general and specific aspects may be implemented using a system, a method, or a computer program, or any combination of systems, methods, and computer programs. The foregoing and other described embodiments can each, optionally, include one or more of the following aspects:

In some embodiments, the method further comprises determining an action selection policy for completing the prior subtask based on an output generated by the SNN for the prior subtask; and controlling operations of the execution device in the prior subtask according to the action selection policy for completing the prior subtask.

In some embodiments, training the VNN for the specified subtask comprises training the VNN for the specified subtask using an output from a VNN for a next subtask that follows the specified subtask in the sequence of subtasks, wherein the VNN for the next subtask receives inputs comprising reach probabilities of the execution device and the one or more other devices reaching a subtask initial state of the next subtask, and the output from the VNN for the next subtask comprises a reward of the execution device in the subtask initial state of the next subtask.

In some embodiments, training a value neural network (VNN) for the specified subtask comprises: obtaining a plurality of sample inputs to the VNN for the specified subtask, wherein each of the plurality of sample inputs comprises: public information of the execution device and the one or more other devices reaching a subtask initial state of the specified subtask; the reach probabilities of the execution device and the one or more other devices reaching a subtask initial state of the specified subtask; for the each of the plurality of sample inputs, calculating a sample reward of the execution device in the subtask initial state of the specified subtask by performing a CFR algorithm; and training the VNN for the specified subtask based on the each of the plurality of sample inputs and the sample reward of the execution device in the subtask initial state of the specified subtask.

In some embodiments, training the SNN for the prior subtask based on the VNN for the specified subtask comprises: predicting a plurality of rewards in the plurality of subtask terminal states of the prior subtask based on an output of the VNN for the specified subtask; and training the SNN for the prior subtask based on the plurality of rewards in the plurality of subtask terminal states of the prior subtask according to a neural-network-based CFR algorithm.

In some embodiments, the method further comprises training another strategy neural network (SNN) for another subtask in the sequence of subtasks based on a VNN for a subtask that follows the another subtask in the sequence of subtasks, wherein the training the another SNN for the another subtask is performed independently from the training the SNN for the prior subtask.

In some embodiments, training the SNN for the prior subtask based on the VNN for the specified subtask is performed in response to determining that a complexity of the prior subtask exceeds a threshold.

It is appreciated that methods in accordance with this specification may include any combination of the aspects and features described herein. That is, methods in accordance with this specification are not limited to the combinations of aspects and features specifically described herein but also include any combination of the aspects and features provided.

The details of one or more embodiments of this specification are set forth in the accompanying drawings and the description below. Other features and advantages of this specification will be apparent from the description and drawings, and from the claims.

BRIEF DESCRIPTION OF THE DRAWINGS

Like reference numbers and designations in the various drawings indicate like elements.

DETAILED DESCRIPTION

Figures 1A, 1B:
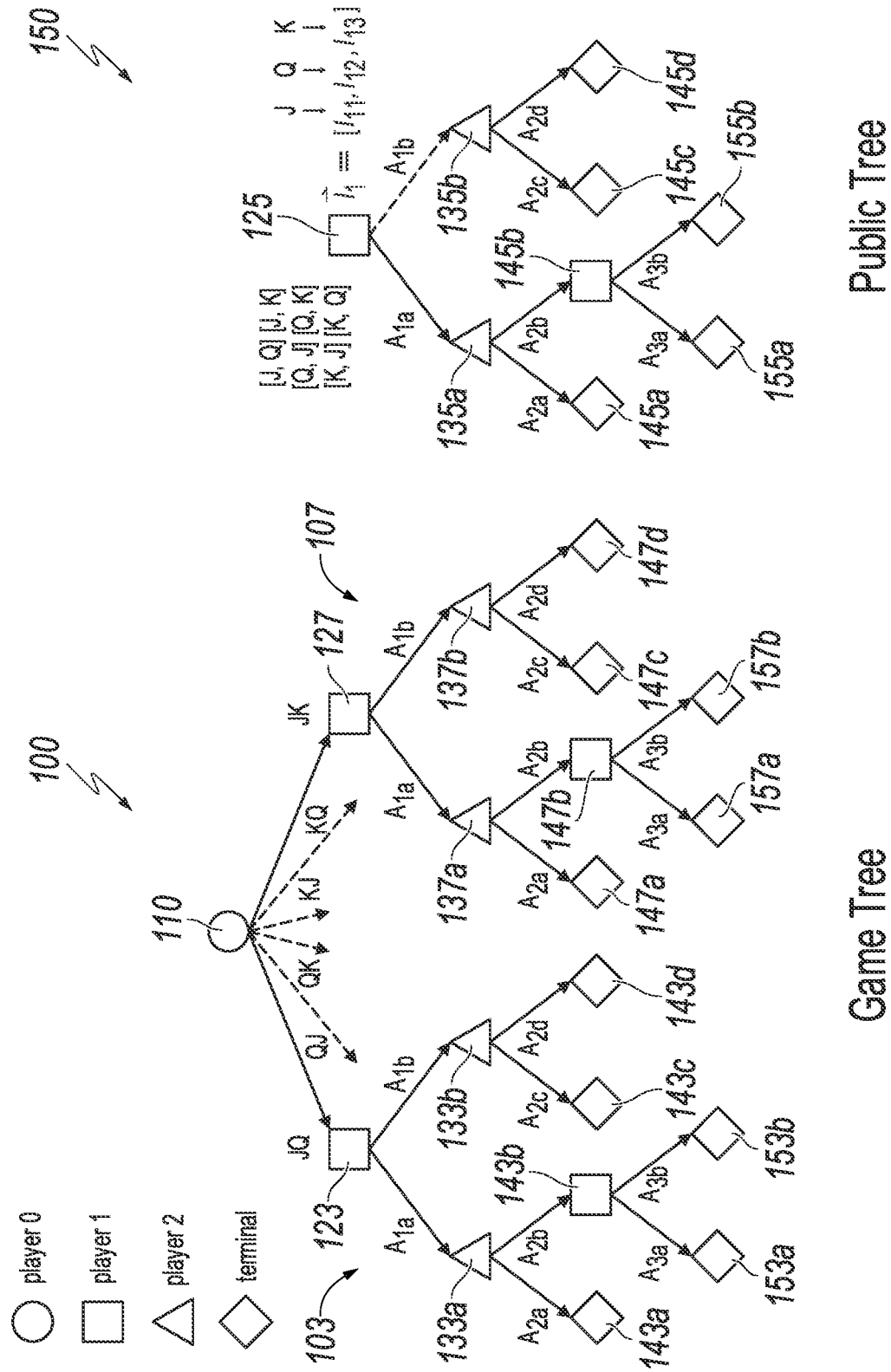
FIGS. 1A and 1B are diagrams illustrating examples of a game tree and a public tree of Kuhn Poker in accordance with embodiments of this specification.

This specification describes techniques for determining an action selection policy for an execution device for completing a task in an environment that includes the execution device and one or more other devices, for example, for strategic interaction between the execution device and the one or more other devices. The strategic interaction among the devices can be represented and modeled as a game. For example, the execution device can perform a computer-implemented method for searching for a Nash equilibrium (including an approximate Nash equilibrium) of a game between the execution device and one or more other devices, and obtain an action selection policy (e.g., a solution or strategy) that leads to Nash equilibrium.

In some embodiments, the techniques can significantly reduce computational complexity for solving a game. In some embodiments, the techniques can solve large or even very-large-scale (VLS) games (also referred to as ultra-large-scale (ULS) games) that represent complex real-world scenarios but are too computationally expensive or impractical to be solved by existing techniques. For example, the described techniques can solve games that are larger in scale (e.g., about two orders of magnitude higher in terms of a game size or complexity) than those can be solved by existing techniques within a reasonable amount of time and spending a reasonable amount of resources.

In some embodiments, the described techniques can save storage space compared to existing techniques. For example, the described techniques can use a storage space that is several orders of magnitude smaller than the existing techniques such as tabular counterfactual regret minimization (CFR) algorithms but obtain a similar or even better result than the existing techniques.

In some embodiments, these techniques can involve performing a counterfactual regret minimization (CFR) algorithm for solving an imperfect information game (IIG). An IIG can represent one or more real-world scenarios such as autonomous vehicle (AV) control, resource allocation, product/service recommendation, cyber-attack prediction and/or prevention, traffic routing, fraud management, trading, bidding, etc. that involve two or more parties (also referred to as players) where each party may have incomplete or imperfect information about another party's decisions. This specification uses Poker as an example of an IIG. The described techniques can be used in many other artificial intelligence (AI) and machine learning applications.

The typical target of solving an IIG is to find a Nash equilibrium so that no player can unilaterally improve the reward. In other words, a Nash equilibrium is a typical solution for an IIG that involves two or more players. Counterfactual Regret Minimization (CFR) is an algorithm designed to approximately find Nash equilibriums for large games. CFR tries to minimize overall counterfactual regrets. It is proven that the average of the strategies in all iterations would converge to a Nash equilibrium. When solving a game, CFR in its original form (also referred to as original CFR, standard CFR, vanilla CFR, or simply, CFR) traverses the entire game tree in each iteration.

A Monte Carlo CFR (MCCFR) was introduced to minimize counterfactual regret. MCCFR can solve imperfect information games from sampled experiences. Different from the original CFR, MCCFR samples a subset of nodes in a game tree in each iteration. The MCCFR can compute an unbiased estimation of counterfactual value and avoid traversing the entire game tree. Since only subsets of all information sets are visited in each iteration, MCCFR requires less memory than the original CFR. MCCFR can include different versions or variants, for example, depending on different sampling polices. MCCFR typically has poor long-term performance and high variance due to the sampling.

Both the original CFR and MCCFR algorithms (and their respective variants such as MCCFR+ algorithms) store iterative and average strategies of the algorithms during each iteration, for example, in a table or other data structures. In some embodiments, the original CFR and MCCFR algorithms can be referred to as tabular CFR algorithms or methods that use one or more tables or other data structures to store strategies of the CFR algorithms during each iteration. The strategies output from the tabular CFR algorithm are strategies actually calculated according to the CFR algorithm of after the CFR algorithm converges over iteration, rather than being predicted or generated based on neutral networks.

The tabular CFR algorithms may require a large amount of memory space and computational power because a size of a game can be large (e.g., in terms of a number of possible states or a game tree size) and the algorithms may take thousands of iterations or more to converge. Accordingly, it may be impractical to use the tabular CFR algorithms with limited memory storage space or computational power to solve large games (e.g., a game that has a total number of possible states in the order of $10^4 \sim 10^9$) or VLS games (e.g., a game that can have a total number of possible states in the order of $10^9$ or above).

In some embodiments, the described techniques can solve large or VLS games in an efficient manner. In some embodiments, the described techniques can be used in automatic control, autonomous vehicle control, robotics, AI poker, recommendation platforms, and many other AI and machine learning applications to provide solutions (e.g., strategies or action selection policies) in real time or substantially real time. As an example, the described techniques can be used in a computer-implemented AI poker system that plays Texas hold'em against human players in real time.

In some embodiments, the described techniques can strategically divide a large or VLS IIG into multiple stages or phases to decouple to a complex game into multiple subgames or subtasks that can be solved more efficiently, especially for real time applications. For example, the large or VLS IIG can be represented by a game tree with a depth of a large number of levels. With the division, each of the multiple subgames can have a much smaller depth with a smaller number of levels than the entire game tree, and each of the multiple subgames can be solved individually with reduced computational resource requirements and improved computational efficiency.

In some embodiments, among the multiple subgames, if a complexity of a subgame is still large (e.g., a subtree corresponding to the subgame is wide), a neural-network-based CFR algorithm can be used to solve the subgame, which can further reduce computational resource requirements and improved computational efficiency. The neural-network-based CFR algorithm uses one or neural networks to predict a strategy that approaches a Nash equilibrium of a game. The described techniques can train one or more strategy neural networks (SNNs) that predict a strategy for a certain subgame. The described techniques can leverage the generalization capability of neural networks and thus do not need supercomputers to calculate and store a large number of strategies to traverse a large subgame or game, especially for real-time applications.

In some embodiments, the SNN for each subgame can be trained based on rewards (also referred to as utility or payoff) of terminal states of the subgame. The terminal states of the subgame are typically non-terminal states of the original game. Thus the rewards of terminal states of the subgame (also referred to as intermediate rewards) are unknown. The strategical division of the entire game allows the intermediate rewards of terminal states of the subgame to be determined in advance, for example, using another type of neural network, referred to value neural network (VNN). In some embodiments, the SNN can be trained based on outputs from the VNN.

In some embodiments, the described techniques allow the SNNs and VNNs to be trained in advance during a training stage. In the application/inference stage, the described techniques can efficiently calculate strategies using the trained SNN in real time.

The techniques described in this specification can generate one or more technical advantages. In some embodiments, the described techniques can determine an action selection policy for an execution device for completing a task in an environment that includes the execution device and one or more other devices. In some embodiments, the described techniques can determine an action selection policy for a software-implemented application that performs actions in an environment that includes an execution party supported by the application and one or more other parties. In some embodiments, the described techniques can be used in automatic control, autonomous vehicle control, robotics, or other application that involves action selections. For example, the determined action selection policy can be used to control engines, motors, actuators, valves, and other equipment or be applied in a control circuit for controlling operations of one or more devices. In one example, a control system of an autonomous vehicle can be adapted to control the speed, acceleration, direction, and/or travel time of the autonomous vehicle, given prediction of movements of other vehicles in the environment. The control system can help the autonomous vehicle to reach a desired destination with better route selection, reduced travel time, and/or lower fuel consumption. This may facilitate, for example, traffic planning, accident avoidance, and increased operational safety.

As an example of an application in autonomous vehicles, the environment can include multiple autonomous vehicles for completing a task such as traffic planning or control to avoid collision and reach respective destinations of the multiple autonomous vehicles. Each of the multiple autonomous vehicles can be equipped with an execution device that can implement software-implemented applications for generating an action selection policy for completing the task in the environment. The generated action selection policy includes control information configured to control one or more of an engine, motor, actuator, brake, etc. of the autonomous vehicle. It can, thus, be used by each of the multiple autonomous vehicles to control one or more engine, motor, actuator, brake, etc. of the autonomous vehicle so that the autonomous vehicle can follow the generated action selection policy to achieve the task. In some embodiments, the task can be modelled by an IIG and the action selection policy to achieve the task can be generated by computer simulation, for example, by solving the IIG. Each of the multiple autonomous vehicles can represent a party of the IIG. The actions can include, for example, one or more of a specified direction, speed, distance, timing, or any other metrics of the autonomous vehicle. The action selection policy of the autonomous vehicle can include a strategy of selecting respective actions at different states (e.g., different intersections in a geographic location) so that the autonomous vehicle can navigate through the environment and reach the destination.

As another example of an application in robotics, the environment can include an industrial robot (e.g., a warehouse robot) that interacts with one or more other parties (e.g., other robots) in order to complete a task (e.g., to move items in the warehouse or to assemble some product). In some embodiments, the task can be modelled by an IIG and the action selection policy to achieve the task can be generated by computer simulation, for example, by solving the IIG. The action can include, for example, one or more of a specified direction, location, speed, or any other motions of the industrial robot. The action selection policy of the industrial robot can include a strategy of selecting respective actions at different states (e.g., different locations in a warehouse) so that the industrial robot can navigate through the environment and complete the task (e.g., moving the items in the warehouse).

In some embodiments, the described techniques can help find better strategies for real-world scenarios such as resource allocation, product/service recommendation, cyber-attack prediction and/or prevention, traffic routing, fraud management, etc. that can be modeled or represented by strategic interaction between parties, such as, an IIG that involves two or more parties, especially large or VLS IIGs that existing techniques fall short of handling due to limited storage space or computational power.

In some embodiments, compared to the tabular CFR algorithms that may only store a limited number of strategies or coarse strategies due to limited storage space in solving large or VLS games that involve a large number of possible actions and states, the described techniques can calculate more refined policies than can lead to better strategies or solutions for the complex real-world scenarios.

In some embodiments, the described techniques can save storage space compared to the existing CFR algorithms. For example, compared to the tabular CFR algorithms, the described techniques can use a storage space that is several orders of magnitude smaller than the tabular CFR algorithms but obtain a similar or even better converged strategy than the tabular CFR algorithms.

In some embodiments, the described techniques can help find strategies of real-world scenarios in a more efficient manner. Accordingly, solutions or strategies of real-world scenarios can be found with a less amount of computer simulation and/or within reduced latency/response time. In some embodiments, the solutions or strategies can be found within a significantly shorter response time, helping make possible certain real-world scenarios that require real-time or near real-time response or control.

In some embodiments, an extensive-form IIG can be represented as follows. There are n players (except for chance) in the IIG. $N=\{1, \ldots, n\}$ is a finite set of the players and each member refers to a player. In a two-player game, $N=\{1,2\}$. These two players are denoted by p1 and p2. The hidden information (variable) of player i is unobserved by the opponents, which is denoted by hv. Each member h∈H refers to a possible history (or state). The history (or state) can include a sequence of actions (including actions of the chance) that lead to the state.

For player i, $h_{-i}^v$ refers to all the players' hidden information except for the player i. The empty sequence ∅ is a member of H. $h_1 \sqsubseteq h$ denotes $h_j$ is a prefix of h. Z denotes the set of terminal histories and any member z∈Z is not a prefix of any other sequences. A terminal history can also be referred to as a terminal state, which can be an end state of the IIG. No further actions needs to be taken by any player in a terminal history. Each terminal history z∈Z has an associated utility or payoff for each player i.

A player function P assigns a member of N∪∪{c} to each non-terminal history, where c refers to the chance player. P(h) is the player who takes actions at h. $A(h)=\{a:ha\in H\}$ is the set of available actions after h∈H\Z. A non-terminal history can also be referred to as a non-terminal state, which can be intermediate state of the IIG. One or more players can have possible actions at a non-terminal state that leads to another state.

$I_i$ of a history $\{h\in H:P(h)=i\}$ is an information partition of player i. A set $I_i\in I_i$ is an information set (infoset) of player i and $I_i(h)$ refers to infoset $I_i$ at state h. For $I_i\in I_i$, we have $A(I_i)=A(h)$ and $P(I_i)=P(h)$. If all players in one game can recall their previous actions and infosets, it is referred to as a perfect-recall game.

Given all players' histories, a prefix tree (trie) can be built recursively. Such a prefix tree is called a game tree in game theory. Each node in the game tree refers to a history h. The infoset tree for each player is built on infosets rather than histories. A public tree is a prefix tree built on public sequences. Each of the public sequences can include actions that are publically known or observable by all players or even by a third-party observer. In some embodiments, a terminal history or a terminal state can be represented by a terminal node or a leaf node of the game tree or public tree. A non-terminal history or a non-terminal state can be represented by a non-terminal node of the game tree or public tree. A terminal history z corresponds to a sequence of actions (also referred to as a terminal sequence of actions) that include actions taken by all players that result in the terminal history z. For example, a terminal history z corresponds to a sequence of actions along a trajectory or path from the root node to the terminal node z of the game tree or public tree that includes actions taken by all players that result in the terminal history z.

FIGS. 1A and 1B are diagrams illustrating examples of a game tree 100 and a public tree 150 of Kuhn Poker in accordance with embodiments of this specification. Kuhn Poker is an example of a zero-sum two-player IIG of poker. Kuhn Poker is an example of an extensive-form game. The game rules are defined as follows. The deck includes only three playing cards, for example, a King (K), Queen (Q), and Jack (J). One card is dealt to each player, which may place bets similarly to a standard poker game. If both players bet or both players pass, the player with the higher card wins, otherwise, the betting player wins.

A game tree is a directed graph. The nodes of the game tree represent positions (or states of a player) in a game. As shown in FIG. 1A, the root node 110 of the game tree 100 is represented by a circle, which is a chance node (also referred to as player 0). Each terminal node or leaf node (e.g., a terminal node 143a, 153a, 153b, 143c, 143d, 147a, 157a, 157b, 147c, or 147d) of the game tree 100 is represented by a diamond, indicating a terminal state which shows a payoff of the one or two players in the game. Each square (e.g., a non-terminal node 123, 127, 143b, or 147b) represents a state of player 1. Each triangle (e.g., a non-terminal node 133a, 133b, 137a, or 137b) represents a state of player 2. In some embodiments, $h_i$ represents a non-terminal node and $z_i$ represents a terminal node.

After each player is dealt with a card, there are six different possible states. As shown by six arrows out of the root node 110, six different possible states are [J, Q], [J, K], [Q, J], [Q, K], [K, J], [K, Q], indicating the card received by player 1 and player 2, respectively. The game tree 100 shows subtrees 103 and 107 of two of the six possible states. The left subtree 103 corresponding to a state [J, Q] indicates that the two players (player 1 and player 2) are dealt with J and Q, respectively. The right subtree 107 corresponding to a state [J, K] indicates that the two players (player 1 and player 2) are dealt with J and K, respectively.

Arrows out of the node (or edges) of the game tree can represent possible actions of a player at the state of the game. As shown in FIG. 1A, the arrows out of the node 123 represent possible actions $A_{1a}$ and $A_{1b}$ of the player 1 at the state of the node 123 corresponding to the state [J, Q]. Similarly, arrows out of the node 133a represent possible actions $A_{1a}$ and $A_{2b}$ of the player 2 at the state of the node 133a corresponding to a state of [J, Q, $A_{1a}$], where the player 1 chooses. Arrows out of the node 133b represent possible actions $A_{2c}$ and $A_{2c}$ of the player 2 at the state of the node 133b corresponding to a state of [J, Q, $A_{1b}$].

The trajectory from the root node 110 to each node is a sequence or history of actions. For example, as illustrated in the subtree 103, the non-terminal node 143b corresponds to a sequence or history of actions (can be denoted as $h_{143b}$) including actions [J, Q, $A_{1a}$, $A_{2b}$]. The terminal node 153b corresponds to a sequence or history of actions (can be denoted as $h_{153b}$) including actions [J, Q, $A_{1a}$, $A_{2b}$, $A_{3b}$]. Since the node 153b is a terminal node, the sequence of actions [J, Q, $A_{1a}$, $A_{2b}$, $A_{3b}$] can be referred to as a terminal sequence of action (that leads to or results in the terminal state 153b. In the subtree 103, the node 143b is a prefix of the terminal node 153b. Similarly, the terminal node 143c corresponds to a sequence or history of actions (can be denoted as $h_{143c}$) including actions [J, Q, $A_{1b}$, $A_{2c}$].

In the IIG, the private card of player 1 is invisible to player 2. Similarly, the private card of player 2 is invisible to player 1. Therefore, the information available to player 1 at node 123 corresponding to the state [J, Q] and the node 127 corresponding to the state [J, K] are actually the same because player 1 only knows his private card J and does not know whether the opponent's, player 2's, private card is Q or K. An information set L can be used to denote the set of these undistinguished states. Let $h_{123}$ denote the state of node 123 and $I_1(h_{123})$ denote the information set at the state of node 123, and $h_{127}$ denote the state of node 127 and $I_1(h_{127})$ denote the information set at the state of node 127. In this example, $I_1(h_{123})=I_1(h_{127})$. Typically, any $I_i \in I$ includes the information observed by player i including player is hidden variables (e.g., private cards) and public actions. In this example, $I_1(h_{123})=I_1(h_{127})=J$, which can be denoted as $I_{11}$.

Similarly, the information available to player 1 at node corresponding to states [Q, J] and [Q, K] are the same, which can be represented by the same information set $I_{12}$ that includes player 1's private card Q. The information available to player 1 at node corresponding to states [K, J] and [K, Q] are the same, which can be represented by the same information set $I_{13}$ that includes player 1's private card K.

FIG. 1B shows the public tree 150 corresponding to the game tree 100. Each node 125, 135a, 135b, 145a, 145b, 145c, 145d, 155a, or 155b in public tree 150 can represent a public state that includes a sequence or history of public actions (also referred to as a public sequence). Each node corresponds to a vector of infosets $\vec{I}_i=[I_{i1},I_{i2},I_{i3}, \ldots ]$. For $\forall I_{ij}, I_{ik} \in I_i$, they can indicate the same public sequence. $|\vec{I}_i|$ refers to the length of the vector. For example, as shown in FIG. 1B, the node 125 corresponds to an initial public sequence, which is empty $\emptyset$ in this example. The node 125 is associated with a vector of infosets of player 1, $\vec{I}_1=[I_{11}, I_{12}, I_{13}]$, corresponding to player 1's private card of J, Q, K, respectively.

As another example, the node 135a can represent a public sequence that includes player 1's action [$A_{1a}$] and corresponds to a vector of infosets of player 2. Similarly, node 135b can represent a public sequence that includes player 1's action [$A_{1b}$], and corresponds to another vector of infosets of player 2. The non-terminal node 145b corresponds to a public sequence that includes public actions [$A_{1a}$, $A_{2b}$]. The terminal node 155b corresponds to a public sequence that includes public actions [$A_{1a}$, $A_{2b}$, $A_{3b}$].

In some embodiments, the non-terminal node 145b in the public tree 150 can represent the common public state among six different possible initial states of [J, Q], [J, K], [Q,J], [Q, K], [K, J], and [K, Q]. The common public state of the non-terminal node 145b includes a public sequence that includes public actions [$A_{1a}$, $A_{2b}$] corresponding to a vector of infosets of player 1 at the non-terminal node 145b, $\vec{I}_1$(node 145b)=[$I_{11}$ (node 145b), $I_{12}$(node 145b), $I_{13}$(node 145b)]. $I_{11}$(node 145b) can represent the information set of player 1 at the non-terminal node 145b that includes player 1's private action and the common sequence that lead to the non-terminal node 145b. That is, $I_{11}$(node 145b)=[J, $A_{1a}$, $A_{2b}$]. Similarly, $I_{12}$ (node 145b)=[Q, $A_{1a}$, $A_{2b}$]; and $I_{13}$ (node 145b)=[K, $A_{1a}$, $A_{2b}$]. The information set $I_{11}$(node 145b) can be shared by the two nodes 143b and 147b in the game tree 100. The node 143b corresponds to a sequence of both private and public actions of all players in the game that leads to the node 143b. That is, $h_{143b}$=[J, Q, $A_{1a}$, $A_{2b}$]. Similarly, the node 147b corresponds to a sequence of both private and public actions of all players in the game that leads to the node 147b. That is, $h_{147 3b}$=[J, K, $A_{1a}$, $A_{2b}$]. As can be seen, $h_{143b}$ and $h_{1473b}$ share the same information set $I_{11}$(node 145b)=[J, $A_{1a}$, $A_{2b}$].

In some embodiments, the strategy and Nash Equilibrium of an IIG can be represented as follows. For a player i∈N, the strategy $\sigma_{-i}(I_i)$ in an extensive-form game assigns an action distribution over $A(I_i)$ to infoset $I_i$. A strategy profile can be denoted as $\alpha=\{\sigma_i|\sigma_i \in \Sigma_i, i \in N\}$, where $\Sigma_i$ is the set of all possible strategies for player i. $\sigma_{-i}$ refers to all strategies in $\sigma$ except for $\sigma_i$. $\sigma_i(I_i)$ is the strategy of infoset $I_i$. $\sigma_i(a|h)$ refers to the probability of action a taken by player i at state h. $\forall h_1, h_2 \in I_i$, $I_i=I_i(h_1)=I_i(h_2)$, $\sigma_i(I_i)=\sigma_i(h_1)=\sigma_i(h_2)$, $\sigma_i(a|I_i)=\sigma_i(a|h_1)=\sigma_i(a|h_2)$. In some embodiments, the strategy $\sigma_i(I_i)$ specifies and comprises a respective probability $\sigma_i(a|h)$ of selecting an action a among the plurality of possible actions in the state h under the strategy $\sigma_i(I_i)$. For example, for player 1 at the node 123 of the game tree 100 in FIG. 1A, the strategy $\sigma i(Ii)$ can include a probability $\sigma_i(A_{1a}|node~123)$ of selecting the action $A_{1a}$ among the two possible actions $A_{1a}$ and $A_{1b}$ in the state of the node 123, and a probability $\sigma_i(A_{1b}|node~123)$ of selecting the action $A_{1b}$ among the two possible actions $A_{1a}$ and $A_{1b}$ in the state of the node 123. If the strategy $\sigma_i(I)$ is uniform (e.g., an initial strategy), the probability $\sigma_i(A_{1a}|node~123)=0.5$, and the probability $\sigma_i(A_{1b}|node~123)=0.5$. In some embodiments, the strategy $\sigma_i(I_i)$ can be updated in each iteration of the CFR so that, when the CFR converges, a player can approach the Nash Equilibrium (or approximate Nash Equilibrium) if the player selects the actions at state h or given the information set I following probabilities specified in the strategy $\sigma_i(I_i)$. For example, if the strategy $\sigma_i(I_i)$ output by the CFR specifies the probability $\sigma_i(A_{1a}|node~123)=0.2$, and the probability $\sigma_i(A_{1b}|node~123)=0.8$. the player can select the action $A_{1b}$ with a probability of 0.8 at state h or given the information set I to approach the Nash Equilibrium (or approximate Nash Equilibrium).

For iterative learning methods such as CFR, at refers to the strategy profile at t-th iteration. $\pi^\sigma(h)$ refers to the state reach probability (also called a state range), which is the product of strategies of all players (including chance, such as the root node 110 in game tree 100) along the history h. For an empty sequence, $\pi^\sigma(\emptyset)=1$.

In some embodiments, the reach probability can be decomposed into $$\pi^\sigma(h)=\Pi_{i\in N\cup\{c\}}\pi_i^\sigma(h)\pi_{-i}^\sigma(h), \quad (1)$$

where $\pi_i^\sigma(h)$ is the product of player i's strategy $\sigma i$ and $\pi_{-i}^\sigma(h)$ is the product of strategies of all players' except I, denoted as $\sigma_{-i}$. $\forall h\in I_i$, $\pi_i^\sigma(h)=\sigma_i^\sigma(I_i)$.

For two histories $h_1$ and $h_2$, $h1\subseteq h2$, $\pi^\sigma(h_1,h_2)$ refers to the product of all players' strategies from history h1 to h2. $\pi_i^\sigma(h_1,h_2)$ and $\pi_{-i}^\sigma(h_1,h_2)$ can be defined in a similar way. The infoset reach probability (infoset range) of $I_i$ can be defined by $\pi_i^\sigma(I_i)=\Sigma_{h\in I_i}\pi_i^{\sigma(h)}$. Similarly, $\pi_{-i}^\sigma(I_i)=\Sigma_{h\in I_i}\pi_{-i}^\sigma(h)$.

For player i, the expected game utility can be computed by $u_i^\sigma=\tau_{z\in Z}\pi^\sigma(z)u_i(z)$. Given a fixed strategy profile $\sigma_{-i}$, a best response is denoted as $$br(\sigma_{-i})=argmax_{\sigma_i'\in\Sigma_i}u_i^{(\sigma_i,\sigma_i)} \quad (2).$$

An $\epsilon$-Nash equilibrium is an approximated Nash equilibrium, whose strategy profile $\sigma^*=(br(\sigma_{-i}), br(\sigma_i))$ satisfies:

$$\forall i\in N, u_i^{(br(\sigma-i),\sigma-i)}+\epsilon\geq max_{\sigma'\in\Sigma_i}u_i^{(\sigma_i,\sigma_i)} \quad (3).$$

Exploitability of a strategy $\sigma_i$ can be defined as $\epsilon_i(\sigma_i)=u_i^{\sigma'}-u_i^{(\sigma_i,br(\sigma_i))}$. A strategy is unexploitable if $\epsilon_i(\sigma_i)=0$. In large two player zero-sum games such as poker, $u_i^{\sigma*}$ can be intractable to compute. However, if the players alternate their positions, the value of a pair of games is zero, i.e., $u_1^{\sigma*}+u_2^{\sigma*}=0$. The exploitability of strategy profile a can be defined as $\epsilon(\sigma)=(u_2^{(\sigma_1,br(\sigma_1))}+u_1^{(br(\sigma_2),\sigma_2)})/2$.

CFR is an iterative method for finding a Nash equilibrium on zero-sum perfect-recall imperfect information games. A counterfactual value $v_i^{\sigma_t}(I_i)$ can be computed to represent an expected utility for player i at the information set $I_i$ under the current strategy profile $\sigma^t$, assuming that player i plays to reach $I_i$. In some embodiments, given $\sigma^t$, the counterfactual value $v_i^{\sigma^t}(I_i)$ can be computed by $$v_i^{\sigma^t}(I_i) = \sum_{h\in I_i}\pi_{-i}^{\sigma^t}(h)\sum_{h\subseteq z, z\in Z}\pi^{\sigma^t}(h,z)u_i(z) = \prod_{-i}^{\sigma^t}(I_i)U_i^{\sigma^t}[I_i]. \quad (4)$$

where $\Pi_{-i}^{\sigma^t}(I_i)\in\mathbb{R}^{1\times d}$ is a matrix of the opponent's range (i.e., the reach probability of the opponent), $U_i^{\sigma^t}[I_i]\in\mathbb{R}^{d\times 1}$ is a matrix of the expected utility value of player i given the information set $I_i$, and d refers to the dimension.

In some embodiments, $$\prod_{-i}^{\sigma^t}(I_i)$$

can be computed as the product of strategies of all players except player i along the history $h\in I_i$, representing a posterior probability of the opponent's actions given that player i reaches the current information set $I_i$ under the current strategy profile $\sigma^t$. $U_i^{\sigma^t}[I_i]$ can represent the expected utility value matrix given that player i reaches the current information set $I_i$ under the current strategy profile at and assuming a uniform distribution of opponent's private actions.

For example, with respect to Kuhn Poker in FIGS. 1A and 1B, $U_i^{\sigma^t}[I_i]$ can represent the expected utility value of player 1 when player 2 is dealt with a private card of J, Q, or K with a uniform distribution, respectively, while $$\prod_{-i}^{\sigma^t}(I_i)$$

can be a vector of a probability of player 2 is dealt with a private card of J, Q, or K, respectively, given that player 1 reaches the current information set $I_i$ under the current strategy profile $\sigma^t$.

As another example, in heads-up no-limit Texas hold'em poker (HUNL), each entry in $$\prod_{-i}^{\sigma^t}(I_i)$$

refers to an opponent's range when dealt with a particular pair of private cards. Each entry in $U_i^{\sigma^t}[I_i]$ refers to the expected utility value given two players' private cards and current strategies.

$v_i^{\sigma^t}(a|I_i)$ refers to the counterfactual value of action a and its regret can be computed by:

$$r_i^{\sigma^t}(a|I_i)=v_i^{\sigma^t}(a|I_i)-v_i^{\sigma^t}(I_i), \quad (5).$$

The cumulative regret of action a after t iterations is $$R_i^t(a|I_i)=R_i^{t-1}(a|I_i)+r_i^{\sigma^t}(a|I_i), \quad (6)$$

where $R_i^0(a|I_i)=0$.

Define $R_i^{t,+}(a|i_t)=max(R_i^t(a|I_i), 0)$, the current strategy at t+1 iteration can be computed based on regret matching according to:

$$\sigma_i^{t+1}(a|I_i) = \begin{cases} \frac{1}{|A(I_i)|}, & \text{if } \sum_{a\in A(I_i)}R_i^{t,+}(a|I_i)=0 \\ \frac{R_i^{t,+}(a|I_i)}{\sum_{a\in A(I_i)}R_i^{t,+}(a|I_i)}, & \text{otherwise.} \end{cases} \quad (7)$$

The average strategy $\overline{\sigma}_i^T$ after T iterations can be computed by $$\sigma_i^T(a|I_i) = \frac{\sum_{t=1}^T \pi_i^{\sigma^t}(I_i)\sigma_i^t(a|I_i)}{\sum_{t=1}^T\sum_{a\in A(I_i)}\pi_i^{\sigma^t}(I_i)\sigma_i^t(a|I_i)}. \quad (8)$$

CFR+ is similar to CFR, except that the CFR+ replaces regret matching by regret matching+ and uses a weighted average strategy. CFR and CFR+ are proven to approach Nash equilibria after enough iterations. The best known theoretical bound for CFR and CFR+ to converge to equilibrium is $$O\left(\frac{1}{\epsilon^2}\right).$$

This bound is slower than first-order methods that converge at rate $$O\left(\frac{1}{\epsilon}\right).$$

However, CFR+ empirically converges much faster than $$O\left(\frac{1}{\epsilon}\right)$$

in many games.

MCCFR computes the unbiased estimate of counterfactual value by sampling subsets of infosets in each iteration. Define $Q=\{Q_1, Q_2, \ldots, Q_m\}$, where $Q_j \in Z$ is a set (block) of sampled terminal histories generated by MCCFR, such that $Q_j$ spans the set Z. Define $q_{Q_j}$ as the probability of considering block $Q_j$, where $$\sum_{j=1}^{m} q_{Q_j} = 1.$$

Define $q(z) = \Sum_{j:z \in Q_j}$ as the probability of considering a particular terminal history z. The particular terminal history z corresponds to a sequence of actions (also referred to as a terminal sequence of actions) that include actions taken by all players that results in the terminal history z. In some embodiments, the probability of considering a particular terminal history z is a probability that the particular terminal history z is sampled (also referred to a probability of a sampled terminal sequence of actions). In some embodiments, the probability of a sampled terminal history z or the probability of a sampled terminal sequence of actions can be computed based on sampling probabilities of all actions included in the sampled terminal sequence of actions that leads to the sampled terminal history z. For example, if the sampled terminal sequence of actions that lead to the sampled terminal history z includes a sequence of actions q(z) can be computed as a product of respective sampling probabilities of all the actions in the sampled terminal sequence of actions $[A_1, A_2, \ldots, A_m]$.

The estimate of sampled counterfactual value (also referred to as estimate counterfactual value) of I can be computed by:

$$\tilde{v}_i^\sigma(I_i \mid Q_i) = \sum_{h \in I_i, z \in Q_j, h \subseteq z} \frac{1}{q(z)} \pi_{-i}^\sigma(z) \pi_i^\sigma(h, z) u_i(z), \quad (9)$$

where $1/q(z)$ can represent the importance of the particular sampled terminal history z in calculating the sampled counterfactual value $\tilde{v}_i^\sigma(I_i|Q_i)$.

Define $\sigma^s$ as sampled strategy profile, where $\sigma_i^s$ is the sampled strategy of player i and $\sigma_{-i}^s$ are those for other players except for player i. The regret of the sampled action $a \in A(I_i)$ can be computed by:

$$\tilde{r}_i^\sigma(I_i, a \mid Q_i) = \tilde{v}_i^{\sigma(I_i, a \mid Q_i)} - \tilde{v}_i^\sigma(I_i \mid Q_i), \quad (10)$$

where $$\tilde{v}_i^\sigma(I_i, \sigma \mid Q_i) = \Sum_{z \in Q_j, h \subseteq z, h \in I_i} \pi_i^\sigma(ha, z) u_i^s(z), \quad (11)$$

where $$u_i^s(z) = \frac{u_i(z)}{\pi_i^{\sigma^s}(z)}$$

is the utility weighted by $$\frac{1}{\pi_i^{\sigma^s}(z)}.$$

The estimate cumulative regret of action a after t iterations is $$\tilde{R}_i^t(I_i, a \mid Q_j) = \tilde{R}_i^{t-1}(I_i, a \mid Q_j) + \tilde{r}_i^{\sigma^t}(I_i \mid Q_j), \quad (12)$$

where $\tilde{R}_i^0(I_i, a \mid Q_j) = 0$.

The current strategy at t+1 iteration can be computed based on regret matching according to Eq. (7) or regret matching+similar to the original CFR. Similarly, the average strategy $\overline{\sigma}_i^T$ after T iterations can be computed according to Eq. (8).

MCCFR provably maintains an unbiased estimate of counterfactual value and converge to Nash equilibrium. Outcome sampling and external sampling are two popular sampling methods. The original outcome sampling chooses one history according to two players' current strategy policy (or ε-greedy). The external sampling is very similar to outcome sampling except for one player taking all actions at her decision node. In each iteration, the classical MCCFR designates one player as the traverser, whose cumulative regret and strategy will be updated on this iteration. After that, another player will be designated as the traverser. Another sampling method, robust sampling, has been proposed, in which the traverser samples k actions and the opponent samples one action. In the robust sampling scheme, each player uses a uniform sampling method to sample at a current decision point, and the other party samples according to a corresponding strategy. The reach probability corresponding to different iterations can be fixed. It can be proved that the robust sampling scheme has a smaller variance than the outcome sampling scheme in MCCFR, while being more memory efficient than the external sampling. In some embodiments, the robust sampling scheme can make the MCCFR solve Nash equilibrium (including approximated Nash equilibrium) with faster convergence.

Figure 2:
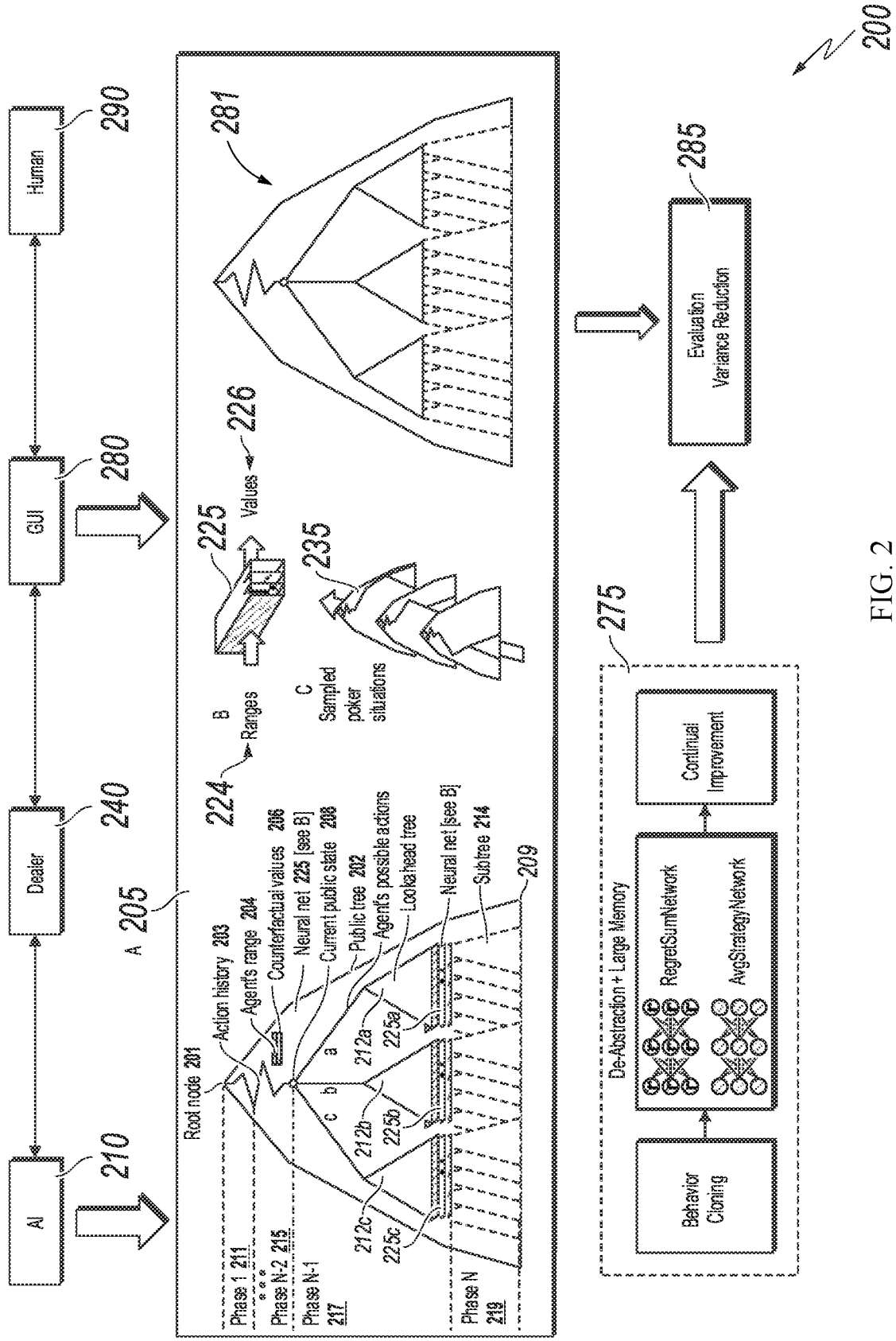
FIG. 2 is a diagram illustrating an example of a computer-implemented system configured to solve a very-large-scale (VLS) imperfect information game (IIG), in accordance with embodiments of this specification.

FIG. 2 is a diagram illustrating an example of a computer-implemented system 200 configured to solve a large or VLS IIG, in accordance with embodiments of this specification. The computer-implemented system 200 can be an example of a computer-implemented AI poker system that plays heads-up no-limit Texas hold'em poker (HUNL) against human players 290, for example, in real time. Note that although HUNL is used as an example of a VLS IIG which the computer-implemented system 200 is configured to solve, the computer-implemented system 200 can be configured to solve one or more other IIGs that represent real-world tasks in an environment that includes an execution device (e.g., associated with a first party or a first player)

and one or more other devices (e.g., associated with other parties or players which may be regarded as opponent of the first party or the first player).

In the standard version of HUNL used in the Annual Computer Poker Competition, at the start, two players each have 20000 chips. HUNL has at most four betting rounds if neither player folds in advance. The four betting rounds are named by preflop, flop, turn, and river respectively.

At the start of each hand, both players are dealt with two private cards from a standard 52-card deck. There are $(52 \times 51)/2=1,326$ distinct possible combinations of two cards from the 52-card deck. One player at the position of the small blind should firstly put 50 chips into the pot and the other player at the big blind should put 100 chips into the pot. Their positions alternate after each hand. Each player can choose actions including fold, call, or raise. If one player chooses fold, then she will lose the money in the pot and this hand is over. If one player chooses call, she should place a number of chips into the pot so that her total chips are equal to the opponent's chips. If one player chooses raise, she should add more chips into the pot than the opponent does. After the preflop round, three public cards are revealed and then the flop betting round occurs. After this round, another public card is dealt and the third betting round takes place. After that, the last public card is revealed, and then the river round begins.

In some embodiments, HUNL can be used to model interactions among multiple devices in a real-world scenario for completing a task. For example, a HUNL can be used to model interactions among an industrial robot (e.g., a warehouse robot) and one or more other parties (e.g., other robots) in order to complete a task (e.g., to move items in the warehouse or to assemble some product). The four rounds of HUNL can represent different sub-tasks in completing the task. Each player of the HUNL can represent a respective robot in the example, which can have different actions (e.g., in terms of movement, speed, directions) in completing the tasks. In some embodiments, HUNL can be used to model additional or different real-world scenarios, and some real-world scenario can be represented by some other large and VLS IIGs.

HUNL is a VLS game that contains about $10^{161}$ information sets (also referred to as infosets). Variants or subgames of HUNL can also be large and VLS games, including, for example, heads-up no-limit preflop hold'em poker (NLPH), heads-up no-limit flop hold'em poker (NLFH), and the river subgame of HUNL (HUNL-R)). NLPH has only one betting round and the value for the terminal node is represented by the expected game utility under the uniform random community cards, which can be precomputed and saved on the disk. NLPH contains $7.8 \times 10^4$ infosets and $1.0 \times 10^9$ states. NLFH is similar to HUNL except there are only the first two betting rounds (preflop and flop) and three community cards. NLFH is a large game and contains more than $4.3 \times 10^9$ infosets and $5.8 \times 10^{12}$ states. The HUNL-R is the fourth betting round of HUNL. At the start of the fourth round, there is $100 in the pot for each player and the ranges of both players are specified by a uniform random policy. HUNL-R contains $2.6 \times 10^4$ infosets and $3.5 \times 10^7$ states.

The computer-implemented system 200 can include an AI subsystem 210, a dealer subsystem 240, and a graphical-type user interface (GUI) 280. The dealer subsystem 240 can be a computer-implemented subsystem that is configured to mimic functions of a dealer or a chance in an IIG. For example, the deal the cards and record a process or progress of the IIG. The GUI 280 is an interface that receives input from one or more human players 290 and display or otherwise output actions of the AI subsystem 210 and results of the IIG. In some embodiments, the GUI 280 can show the process of the IIG in real time, e.g., by showing the trajectory of actions of players along a game tree 281 representing the IIG. The AI subsystem 210 can execute algorithms for solving the IIG for an Agent (e.g., a party or player of the IIG), for example, according to the techniques described in accordance with embodiments of this specification, including a process 300 described below. In some embodiments, the AI subsystem 210 can function as an execution device for the Agent.

In some embodiments, the AI subsystem 210 can include a neural network module 275 that can perform one or more neural-network-based CFR algorithms for solving the IIG or a phase of the IIG. The neural network module 275 can learn strategies of the IIG or a phase of the IIG during iterations of a CFR algorithm, for example, based on a double neural CFR algorithm. As an example, the double neural CFR algorithm can use one neural network (e.g., a Regret Sum Network) to learn about a cumulative regret and the other one (e.g., an Average Strategy Network) to learn about an average strategy for each iteration of the double neural CFR algorithm. The neural-network-based CFR algorithms can dynamically learn and generate strategies of the IIG or a phase of the IIG based on behavior cloning capability. In some embodiments, the neural-network-based CFR algorithms can provide continual improvement of the generated strategy of the IIG or a phase of the IIG during a prediction or application stage of the trained neural networks.

In some embodiments, the neural network module 275 can also train one or more value neural networks (VNNs) to infer, estimate, or otherwise predict intermediate rewards (e.g., counterfactual values (CFVs)) of terminal nodes of a phase of the IIG.

In some embodiments, the AI subsystem 210 can include an evaluation and variance reduction module 285 that can evaluate the performances of the strategies output by neural network module 275. The evaluation and variance reduction module 285 can perform one or more variance reduction algorithms to further reduce the variance of the output strategies and provide further performance improvement.

Figure 3:
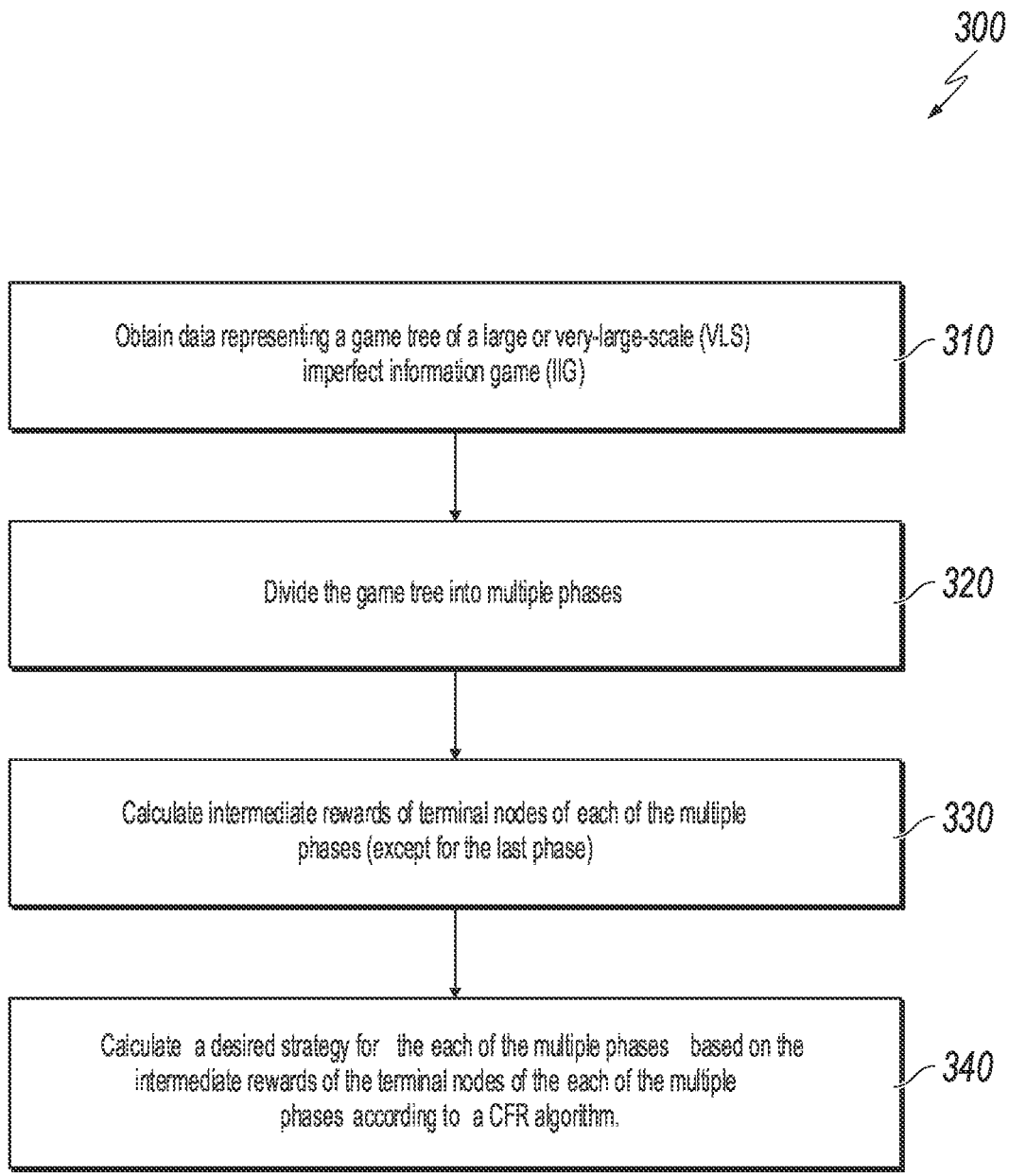
FIG. 3 is a flowchart of an example of a process for solving a large or very-large-scale (VLS) imperfect information game (IIG), in accordance with embodiments of this specification.

FIG. 3 is a flowchart of an example of a process 300 for solving a large or very-large-scale (VLS) imperfect information game (IIG), in accordance with embodiments of this specification. The process 300 can be an example of algorithms performed by the AI subsystem 210 for solving the VLS IIG.

In some embodiments, the example process 300 shown in FIG. 3 can be modified or reconfigured to include additional, fewer, or different operations, which can be performed in the order shown or in a different order. In some instances, one or more of the operations can be repeated or iterated, for example, until a terminating condition is reached. In some implementations, one or more of the individual operations shown in FIG. 3 can be executed as multiple separate operations, or one or more subsets of the operations shown in FIG. 3 can be combined and executed as a single operation.

At 310, data representing a game tree of a large or VLS IIG can be obtained. FIG. 2 shows a game tree A 205 representing a VLS IIG, e.g., HUNL. The game tree 205 can correspond to a public tree 202, for example, in a similar manner as the game tree 100 and the public tree 150 of FIGS. 1A and 1B. The game tree 205 has a root node 201, multiple non-terminal nodes (e.g., a non-terminal node 231 that corresponds to a current public state 208 resulting from an action history 203), and multiple terminal nodes 209.

At 320, the game tree representing the VLS IIG can be divided into multiple stages or phases (e.g., N phases, N>=2) in a sequence. The multiple stages or phases can be traversed sequentially for finding a Nash equilibrium of the VLS IIG. The multiple phases can include a top or first phase (e.g., Phase 1 211) that starts with the root node 201 and a last phase (e.g., Phase N 219) that ends with the terminal nodes 209. The multiple phases can also include one or more intermediate phases (e.g., Phase p, Phase N-2, 215 and Phase N-1 217). Each of the one or more intermediate phases can include more than one root nodes of the intermediate phase and more than one terminal node of the intermediate phase. The terminal nodes of a specified phase (e.g., terminal nodes of Phase N-1 217) in the sequence of the multiple phases (except for the last phase) are the root nodes of the phase immediately following the specified phase (e.g., root nodes of Phase N 219). In other words, root nodes of a specified phase (e.g., root nodes of Phase N 219) are terminal nodes of a prior phase that immediately precedes the specified phase (e.g., terminal nodes of Phase N-1 217) in the sequence of the multiple phases.

In some embodiments, the multiple phases can be divided based on computational resources (e.g., computational power and/or storage space) of the AI subsystem 210, for example, to make each of the multiple phases solvable in an efficient manner such that the AI subsystem 210 can play against human players in real time during the entire VLS IIG. The total number of the multiple phases can be the same as or different from the total number of rounds of an IIG. As an example, although the HUNL can have four betting rounds (i.e., preflop, flop, turn, and river), the HUNL can be divided into three phases. The first phase can be the preflop round, which starts from the initial position (or state) and ends where the three community cards (or public cards) are issued by the chance node (e.g., the dealer subsystem 240). The second phase can be the flop round, which starts with a terminal state of the first phase and ends where the fourth community card is issued by the chance node. The third phase can include the last two rounds (i.e., turn and river rounds) of the HUNL.

In some embodiments, the division of the game tree representing the VLS IIG into the multiple phases can compress or shorten a depth of the game tree, thus simplifying the computation of the entire game tree. For example, the game tree representing the VLS IIG may be a deep game tree with a large number of levels (e.g., with a depth in the order of tens, hundreds or even more). A phase of the game tree can combine two or more levels of the game tree together and the combined two or more levels of the game tree can be considered as a subgame. Accordingly, the division of the game tree can convert a deep game tree into multiple, more manageable subgames. In some embodiments, the multiple phases (or subgames) can be decoupled and solved independently from each other, allowing the entire VLS IIG to be solved more efficiently, for example, by distributive or parallel processing. In some embodiments, to decouple the multiple phases, intermediate rewards of terminal nodes of each phase may be needed to solve for a Nash equilibrium of the phase, for example, according to a CFR algorithm.

At 330, intermediate rewards of terminal nodes of the each of the multiple phases (except for the last phase) can be calculated. Typically, only terminal nodes of the entire game tree (thus the terminal node of the last phase, e.g., terminal nodes 209 in FIG. 2) have respective known rewards (e.g., utility values). To decouple and solve each of the multiple phases of the entire game individually and independently, intermediate rewards of terminal nodes of the each of the multiple phases (except for the last phase) can be calculated. In some embodiments, due to the size of the large or VLS IIG and a large number of possible actions of each player, even for a phase of the large or VLG IIG, it is computationally expensive or impractical to enumerate and calculate each intermediate reward of the phase. In some embodiments, a respective intermediate reward of each terminal node of the each of the multiple phases (except for the last phase) can be calculated, for example, by using a neural network.

In some embodiments, a value neural network (VNN) is trained to infer, estimate, or otherwise predict intermediate rewards (e.g., counterfactual values (CFVs)) of the root nodes of one of the multiple phases. In the example shown in FIG. 2, for Phase N-1 217, a VNN 225 is trained to predict rewards (e.g., CFVs) of the root node 231 of Phase N-1 217 corresponding to the current public state 208. The VNN 225 can receive inputs including ranges (i.e., reach probabilities) and generate outputs including values 226 (e.g., rewards). As an example, the VNN 225 at the root node 231 can receive inputs including the Agent's ranges 204 at the root node 231 and generate outputs including Opponent's CFVs 206 at the root node 231.

Note that the root node 231 of Phase N-1 217 is also a terminal node of the prior phase, Phase N-2 215. The root node 231 can be branched into three subtrees 212a, 212b, and 212c based on the Agent's possible actions a, b, and cat the root node 231, respectively. The three subtrees 212a, 212b, and 212c can be referred to as lookahead trees at the root node 231. The terminal nodes of each of the three subtrees 212a, 212b, and 212c are root nodes of the next phase, Phase N 219. In some embodiments, for Phase N 219, VNNs 225a, 225b, and 225c are trained to predict rewards (e.g., CFVs) of root nodes of Phase N 219, which are the terminal nodes of the three subtrees 212a, 212b, and 212c. As shown in FIG. 2, each root node of the next phase, Phase N 219 has a corresponding subtree 214 with terminal nodes 209 in the next phase, Phase N 219.

In some embodiments, the VNN for each of the multiple phases can be trained according to example techniques described in accordance with embodiments of this specification, including operations described w.r.t. a process 400 described below, or other techniques (e.g., algorithmic game theory techniques for interfering values of game tree nodes).

In the above example of HUNL, two VNNs, a preflop VNN and a flop VNN can be trained to predict the intermediate rewards (e.g., CFVs) of the terminal nodes of the first phase (e.g., the preflop round) and the second phase (e.g., the flop round) of the HUNL, respectively.

At 340, a desired strategy for each of the multiple phases can be calculated based on the intermediate rewards of the terminal nodes of the each of the multiple phases, for example, according to a CFR algorithm. The desired strategy can be, for example, a strategy that corresponds to a Nash equilibrium, an approximate Nash equilibrium, a best response or an optimal or optimized strategy given certain restrictions (e.g., a number of iterations or convergence condition) that is obtained according to the CFR algorithm.

The CFR algorithm can be one or more existing tabular CFR algorithms or their variants, or a double neural CFR algorithm. In some embodiments, if a complexity of a specified phase is not beyond the threshold (e.g., that would result in a large computational load and/or storage space of the AI subsystem 210), one or more existing tabular CFR algorithms or their variants can be used to find a desired strategy for the particular phase. The complexity of a specified phase can be measured, for example, by a complexity of a state-space complexity, a game tree size, or another complexity measure of a game. For example, the complexity of a specified phase can be measured by a width of the specified phase of the game tree.

In some embodiments, if the complexity of a specified phase is beyond the threshold, a neural-network-based CFR algorithm (e.g., a double neural CFR algorithm) can be used to find a desired strategy for the specified phase. The neural-network-based CFR algorithm can use one or more neural networks to learn strategies of different states or nodes of a phase of the game tree. For example, a CFR algorithm typically require a number of iterations (e.g., in the order of $10^3$ or more) to converge. One or more neural networks can be trained to learn strategies of different states or nodes of a game tree over the number of iterations. The neural network can receive input such as information of a state (e.g., a history of actions that reaches the state, public information known in the state, and private information of the party at the state) and outputs a projected strategy for the party in the state.

As an example of the neural-network-based CFR algorithm, the double neural CFR algorithm can use two neural networks to compute approximate Nash equilibrium of an IIG that corresponds to the desired strategy. For example, one of the neural networks (e.g., a RegretSumNetwork) can be used to learn about a cumulative regret and the other one (e.g., an Average Strategy Network) can be used to learn about an average strategy over iterations of the double neural CFR algorithm. After reaching convergence, the double neural CFR algorithm can output a desired strategy based on the learned data in the Average Strategy Network. Example techniques of the double neural CFR algorithm are described in PCT App. No. PCT/CN2019/072204, filed on Jan. 17, 2019, entitled "STRATEGY SEARCHING IN STRATEGIC INTERACTION BETWEEN PARTIES" and in U.S. application Ser. No. 16/448,947, filed on Jun. 21, 2019, entitled "STRATEGY SEARCHING IN STRATEGIC INTERACTION BETWEEN PARTIES," and each application is hereby incorporated by reference in its entirety.

In effect, after obtaining the intermediate rewards of the terminal nodes of the each of the multiple phases, the each of the multiple phases can be regarded as an individual subgame (that may include more than one root node) with known rewards at the terminal nodes of the individual subgame. The neural-network-based CFR algorithm (e.g., the double neural CFR algorithm) can be applied to solve the individual subgame. The individual subgame has a much smaller size than the original game tree representing the large or VLS IIG. In some embodiments, because the multiple individual subgames are decoupled with their respective known intermediate rewards of their terminal nodes, the multiple individual subgames corresponding to the multiple phases can be solved independently. In some embodiments, the multiple individual subgames corresponding to the multiple phases can be solved in parallel to further improve computational efficiency of solving the entire large or VLS IIG.

In the above example of HUNL, a preflop SNN for predicting a desired strategy for the first phase (e.g., the preflop round) and a flop SNN for predicting a desired strategy for the second phase (e.g., the flop round) can be obtained, respectively, for example, according to a neural-network-based CFR algorithm. In some embodiments, because the complexity of the third phase (e.g., including the last two rounds) is relatively low, a desired strategy for the third phase can be obtained performing a tabular CFR algorithm (e.g., a MCCFR algorithm).

In some embodiments, unlike existing techniques that may abstract the original HUNL and then directly solves the four rounds of HUNL but with very rough approximations or very few actions at each decision point (e.g., due to the limited computational resources compared to the large size of HUNL), the example process 300 can use the SNNs to make each phase of the HUNL more manageable. Accordingly, the example process 300 can perform more refined action abstraction to get better strategies for the entire HUNL.

In some embodiments, in a process of playing against one or more human players, a desired strategy for each of the multiple phases can be calculated on a trained SNN or by performing a CFR algorithm for the each of the multiple phases in real time. In the above example of HUNL, a desired strategy for the first phase (e.g., the preflop round) can be calculated based on the preflop SNN. A desired strategy for the second phase (e.g., the flop round) can be obtained based on the flop SNN. In some embodiments, a continuous solving technology can be used to solve the third phase (e.g., including the last two rounds) of the HUNL to find the desired strategy for the third phase in real time.

Figure 4:
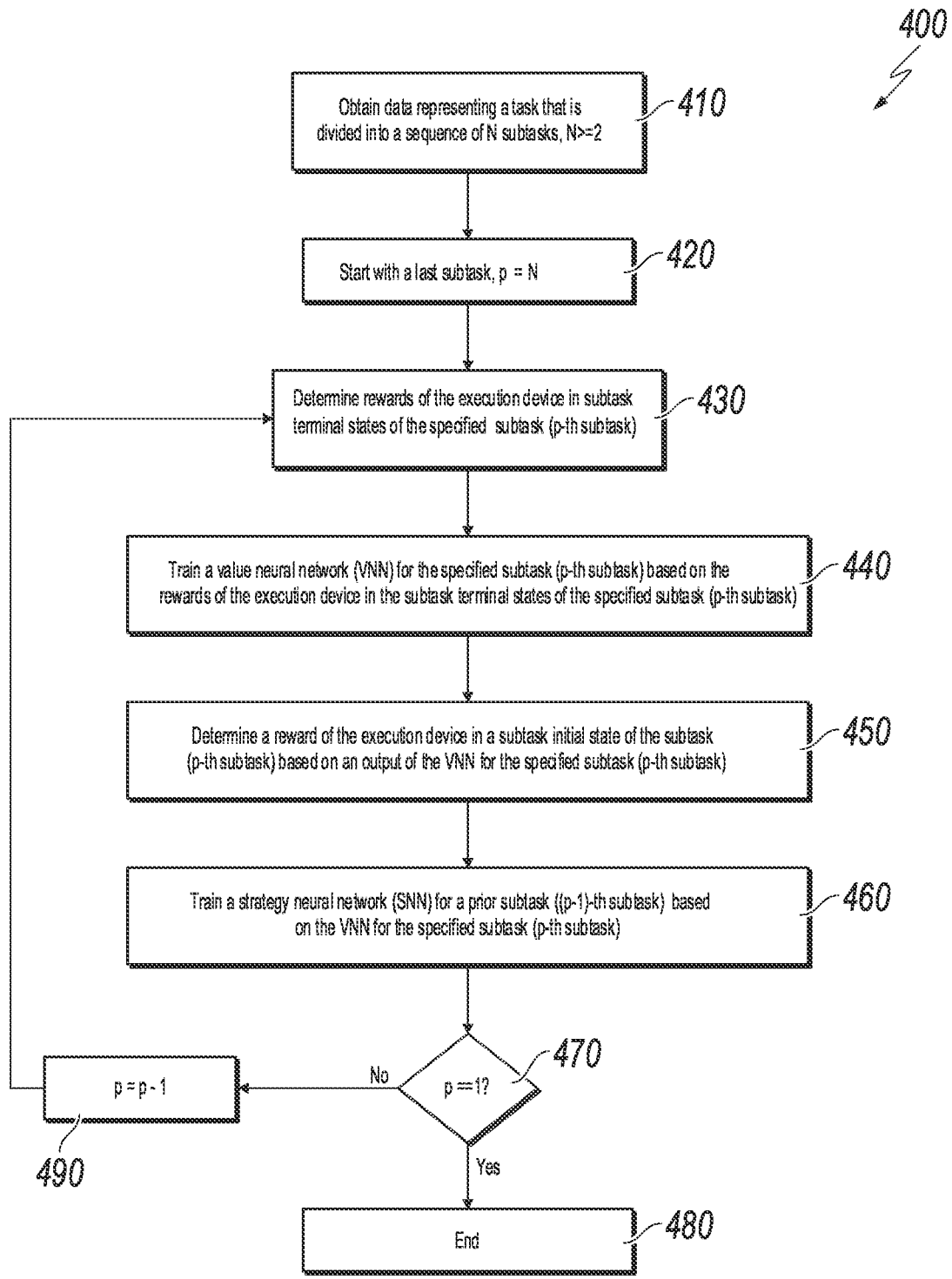
FIG. 4 is a flowchart of an example of a process for generating an action selection policy for causing an execution device to complete a task in an environment that includes the execution device and one or more other devices, in accordance with embodiments of this specification.

FIG. 4 is a flowchart of an example of a process 400 for generating an action selection policy causing an execution device to complete a task in an environment that includes the execution device and one or more other devices, in accordance with embodiments of this specification. The process 400 can be performed, for example, by the AI subsystem 210 in performing some or all operations of the process 300 for solving the large or VLS IIG. The process 400 can be performed, for example, in a training stage for generating the action selection policy causing the execution device to complete the task. For example, the process 400 can be performed to train a strategy neural network (SNN) for a specified subtask of the task, wherein the SNN can be trained based on outputs from a value neural network (VNN) that estimate intermediate rewards of terminal nodes of the specified subtask of the task.

In some embodiments, the example process 400 shown in FIG. 4 can be modified or reconfigured to include additional, fewer, or different operations, which can be performed in the order shown or in a different order. In some instances, one or more of the operations can be repeated or iterated, for example, until a terminating condition is reached. In some implementations, one or more of the individual operations shown in FIG. 4 can be executed as multiple separate operations, or one or more subsets of the operations shown in FIG. 4 can be combined and executed as a single operation.

In some embodiments, the process 400 can be based on a CFR algorithm (e.g., a tabular CFR algorithm and/or its variants). The intermediate rewards of terminal nodes of each of multiple phases (except for the last phase) of the game tree can be counterfactual values (CFVs), for example, computed according to Eq. (4). The CFR algorithm can include multiple iterations before it converges. In some embodiments, each iteration of a CFR algorithm can include a bottom-up process for computing CFVs and updating action selection policies of different states. In some embodiments, a state can be represented by a node of the game tree (e.g., a non-terminal node 123, 127, 143*b*, or 147*b* or a terminal node 143*a*, 153*a*, 153*b*, 143*c*, 143*d*, 147*a*, 157*a*, 157*b*, 147*c*, or 147*d* of the game tree 100 in FIG. 1A). In some embodiments, the state can be a public state represented by a node of a public tree (e.g., a non-terminal node 125, 135a, 135b, or 145b, or a terminal node 145a, 145c, 145d, 155a, or 155b of the public tree 150 in FIG. 1B). In some embodiments, the state corresponds to a public sequence that comprises one or more actions publically known by the execution device and the one or more other devices that in a trajectory starting from an initial state (e.g., a root node of the public tree) and ending in the state. For example, the state of the node 155b corresponds to a public sequence (e.g., the public sequences [$A_{1a}$, $A_{2b}$, $A_{3b}$,]) that comprises one or more actions publically known by the execution device (e.g., $A_{1a}$, and $A_{3b}$,]) and the one or more other devices (e.g., $A_{2b}$) from the root node 125 to following the node 155b. In some embodiments, the CFR algorithm can start from terminal states of the game tree (e.g., the leaf node or terminal node 143a, 153a, 153b, 143c, 143d, 147a, 157a, 157b, 147c, or 147d of the game tree 100 in FIG. 1A, or the terminal node 145a, 145c, 145d, 155a, or 155b of the public tree 150 in FIG. 1B) and move up to the initial state of the game tree (e.g., the root node 110 of the game tree 100 in FIG. 1A or the root node 125 of the public tree 150 in FIG. 1B).

At 410, data representing a task that is divided into a sequence of subtasks are obtained. The total number of the sequence of subtasks is N, where N>=2. In some embodiments, the task can be modeled by an IIG represented by a game tree (e.g., the game tree 100 of FIG. 1A or the game tree 205 of FIG. 2). In some embodiments, the task can be complicated real-world large scenarios that includes a large number of possible actions and states, for example, modeled by a large or VLS IIG. In some embodiments, the data dividing the task into the sequence of subtasks can include, for example, data presenting the task (e.g., in the form of the game tree and/or other associated data (e.g., nodes, actions, states, or infosets) as described w.r.t. FIGS. 1-3)), data representing the division (e.g., a total number of the subtasks, a sequence of subtasks, a beginning and end of each of the sequence of subtasks, etc.), and/or data representing each of the sequence of subtasks (e.g., in the form of one or more subtrees include in the phase of the game tree).

Each state of the task can correspond to a node of the game tree representing the task. For example, the task can include a plurality of task terminal states (e.g., corresponding to terminal or leaf nodes of the game tree) and a plurality of non-task-terminal states (e.g., corresponding to non-terminal nodes of the game tree). The plurality of the task terminal states have respective rewards (or payoffs or utility values) in the task terminal states. Each of the task terminal states can result from a sequence of actions (e.g., an action history 203) taken by the execution device and by the one or more other devices in a subset of the plurality of non-task-terminal states. As another example, the terminal state (e.g., terminal node 155b in FIG. 1B) results from a sequence of actions (e.g., a sequence of actions [$A_{1a}$, $A_{2b}$, $A_{3b}$]) that includes actions taken at a plurality of non-terminal states (e.g., the non-terminal nodes 125, 135a, and 145b) by the execution device (e.g., $A_{1a}$ and $A_{3b}$) and by the one or more other devices (e.g., $A_{2b}$).

In some embodiments, the task can be divided into the sequence of subtasks, for example, to reduce the complexity for solving the task. In some embodiments, each subtask in the sequence of subtasks can correspond to each of the multiple phases as described w.r.t. FIGS. 2-3. In some embodiments, the task can be divided, for example, based on computational resources of the execution device, the requirement on response time for completing the task, the size of the game tree representing the task, etc., according to the techniques described w.r.t. the operation 320 of the process 300 or some other techniques.

Each subtask in the sequence of subtasks comprises a plurality of subtask states of the subtask. The plurality of subtask states can include one or more subtask initial states, a plurality of subtask non-terminal states, and a plurality of subtask terminal states of the subtask.

Among the sequence of N subtasks, a first subtask in the sequence of subtasks comprises the task initial state as a subtask initial state of the first subtask. A last subtask (i.e., the N-th subtask) in the sequence of subtasks comprises a plurality of subtask initial states of the last subtask and a plurality of subtask terminal states of the last subtask. The plurality of subtask initial states of the last subtask are subtask terminal states of a second last subtask that precedes the last subtask in the sequence of subtasks. The plurality of subtask terminal states of the last subtask are the plurality of the task terminal states.

For example, the last subtask can correspond to a last phase of the game tree, such as Phase N 219 of the game tree 205 FIG. 2. The plurality of subtask terminal states of the last subtask are the plurality of the task terminal states (e.g., the terminal nodes 209). The plurality of subtask initial states of the last subtask can correspond to root nodes of the last phase of the game tree such as the non-terminal nodes 229. The plurality of subtask terminal states of the last subtask can correspond to terminal nodes of the last phase of the game tree such as the terminal nodes 209. The plurality of subtask initial states of the last subtask are subtask terminal states of a second last subtask that precedes the last subtask in the sequence of subtasks (e.g., corresponding to a second last phase of the game tree such as Phase N 219).

The process 400 can include a bottom-up process of training a respective VNN of each subtask in the sequence of N subtask. A current subtask can be denoted or otherwise specified as the p-th subtask, $1<=p<=N$. At 420, let p=N, and the process 400 starts from a last subtask (i.e., N-th subtask) in the sequence of N subtasks. The last subtask can correspond to the last phase of a game tree (e.g., Phase N 219 of the game tree 205).

For example, given that the game tree (e.g., the game tree representing a VLS IIG such as HUNL) is divided into N phrases, N>=2, a current phase of the game tree is the p-th phase, where $1<=p<=N$. The process 400 starts from the last phase of the game tree, i.e., p=N, because the rewards of the terminal nodes of the last phase of the game tree are the terminal nodes of the game tree, which are known and can be used to compute intermediate rewards (e.g., CFVs) of terminal nodes of each of other phases of the game tree in a bottom-up manner according to the CFR algorithm.

At 430, rewards of the execution device in subtask terminal states of the subtask (p-th subtask) are determined. For the last subtask (i.e., N-th subtask) in the sequence of N subtasks, rewards of the execution device in subtask terminal states of the last subtask are known because the subtask terminal states of the last subtask are the task states of the entire task. The rewards of the execution device in subtask terminal states of the last subtask can be determined, for example, based on the data representing the task obtained at 410.

For a specified subtask (p-th subtask) other than the last subtask (i.e., N-th subtask) in the sequence of N subtasks, rewards of the execution device in subtask terminal states of the specified subtask (p-th subtask) are rewards of the execution device in subtask initial states of a next subtask ((p+1)-th subtask) that immediately follows the specified subtask (p-th subtask) in the sequence of N subtasks. The rewards of the execution device in subtask initial states of the next subtask ((p+1)-th subtask) can be determined, for example, based on a trained value neural network (VNN) for the next subtask ((p+1)-th subtask) in a similar manner as described w.r.t. 450 below.

At 440, a value neural network (VNN) for the specified subtask (p-th subtask) is trained based on the rewards of the execution device in the subtask terminal states of the subtask (p-th subtask). The VNN (e.g., VNN 225 at the root node 231 of Phase N-1 217) for the specified subtask (p-th subtask) predicts a reward of the execution device (e.g., CFV of Agent (or equivalently, CFV of the Opponent because of a zero-sum game) in the subtask initial state of the specified subtask (e.g., at the root node 231 of Phase N-1 217). In some embodiments, more than one VNNs can be trained for the specified subtask (p-th subtask). For example, as shown in FIG. 2, three VNNs 225a, 225b, and 225c are trained for Phase N 219.

In some embodiments, the VNN for the specified subtask (p-th subtask) receives inputs comprising reach probabilities (e.g., ranges 224) of the execution device and the one or more other devices reaching a subtask initial state of the specified subtask. In some embodiments, the reach probability of the one or more other devices reach a state comprises a product of probabilities of actions taken by the one or more other devices reach the state. In the example shown in FIGS. 1A and 1B, if the execution device corresponding to player 1, the reach probability of the one or more other devices (e.g., corresponding to player 2) reaching a state (e.g., terminal node 155b) comprises a product of probabilities of actions (e.g., $A_{2b}$) taken by the one or more other devices reach the state. If the execution device corresponding to player 2, the reach probability of the one or more other devices (e.g., corresponding to player 1) reaching the state (e.g., terminal node 155b) comprises a product of probabilities of actions (e.g., $A_{1a}$ and $A_{3b}$) taken by the one or more other devices that reach the state.

In some embodiments, the inputs further comprises public information of the execution device and the one or more other devices reaching the subtask initial state of the specified subtask. In some embodiments, the public information includes a sequence of actions (e.g., action history 203) taken by the execution device and the one or more other devices reaching the subtask initial state of the specified subtask (e.g., public state 208 at the root node 231 of Phase N-1 217), and/or other public information that would affect a result of the task. For example, in the example of HUNL, the public information includes a pot size (and/or the parties' action history) and the community cards known at the subtask initial state of the specified subtask. In some embodiments, the inputs can be represented by an information set as described above.

In some embodiments, training the VNN for the specified subtask comprises training the VNN for the specified subtask using outputs from a VNN for a next subtask ((p+1)-th subtask) that follows the specified subtask in the sequence of subtasks. The VNN for a next subtask ((p+1)-th subtask) predicts a reward of the execution device in the subtask initial state of the next subtask ((p+1)-th subtask). Accordingly, the outputs from the VNN for the next subtask ((p+1)-th subtask) comprise a reward of the execution device in the subtask initial state of the next subtask ((p+1)-th subtask), which is a reward of the execution device in the subtask terminal state of the specified subtask (p-th subtask). The VNN for the next subtask ((p+1)-th subtask) receives inputs comprising reach probabilities of the execution device and the one or more other devices reaching a subtask initial state of the next subtask ((p+1)-th subtask).

In some embodiments, in training the VNN for the specified subtask, a plurality of sample inputs (e.g., sampled poker situation 235 of FIG. 2) to the VNN for the specified subtask are obtained. In some embodiments, as described above, each of the plurality of sample inputs can comprise public information of the execution device and the one or more other devices reaching the subtask initial state of the specified subtask, and the reach probabilities of the execution device and the one or more other devices reaching a subtask initial state of the specified subtask. In some embodiments, the each of the plurality of sample inputs can be generated, for example, by random sampling or in another manner. For example, in HUNL, the public information (e.g., the community cards and the pot size) can be generated by sampling the deck and a number of chips in the pot according to the rules of HUNL. The reach probabilities of the execution device and the one or more other devices reaching the subtask initial state of the specified subtask can be generated based on one or more assumed, estimated, or predetermined probability distributions. For example, the reach probability of the execution device reaching the subtask initial state of the specified subtask can be a value between 0 and 1 generated randomly based on a predetermined probability distribution. Similarly, the reach probability of the one or more other devices reaching the subtask initial state of the specified subtask can be another random value between 0 and 1 generated randomly based on another predetermined probability distribution.

For the each of the plurality of sample inputs, a sample reward of the execution device in the subtask initial state of the specified subtask can be calculated, for example, by performing a CFR algorithm in a bottom-up manner using outputs from the VNN for the next subtask ((p+1)-th subtask) that include the reward of the execution device in the subtask terminal state of the specified subtask (p-th subtask). In some embodiments, the CFR algorithm may require a plurality of iterations (e.g., in the order of $10^3$ or more) to converge. As such, for each of the plurality of sample inputs, the plurality of iterations of the CFR algorithm are performed to obtain a respective sample reward of the execution device in the subtask initial state of the specified subtask. The VNN for the specified subtask is trained based on the each of the plurality of sample inputs and the sample reward of the execution device in the subtask initial state of the specified subtask.

In some embodiments, a total number of the plurality of sample inputs to the VNN can be in the order of $10^3$, $10^4$, or more, to provide a good performance of the VNN in learning and predicting the reward of the execution device. In some embodiments, a total number of the plurality of sample inputs depends on a complexity of the subtask. In some embodiments, the more complex the subtask (e.g., the wider the phase of the game tree) is, the more sample inputs to the VNN may be needed to provide a good approximation and behavior cloning. The VNN for the specified subtask can be trained over the total number of the plurality of sample inputs and the respective sample rewards to estimate or predict the reward of the execution device in the subtask initial state of the specified subtask.

At 450, a reward of the execution device in a subtask initial state of the subtask (p-th subtask) is determined based on outputs of the VNN for the specified subtask (p-th subtask). With the trained VNN for the specified subtask (p-th subtask), for each subtask initial state of the subtask (p-th subtask), by providing an input into the trained VNN, an output of the VNN can include a reward of the execution device in the each subtask initial state of the subtask (p-th subtask). If the subtask (p-th subtask) has more than one subtask initial states, respective rewards of the execution device in all subtask initial states of the subtask (p-th subtask) can be determined. The rewards of the execution device in all subtask initial states of the subtask (p-th subtask) are the respective rewards of the execution device in the subtask terminal states of the prior subtask ((p−1)-th subtask), which can be used for training a strategy neural network (SNN) for a prior subtask ((p−1)-th subtask) as described w.r.t. 460.

At 460, a strategy neural network (SNN) for a prior subtask ((p−1)-th subtask) is trained based on the VNN for the specified subtask (p-th subtask). The SNN for the prior subtask ((p−1)-th subtask) predicts an action selection policy of the execution device in a subtask state of the prior subtask ((p−1)-th subtask). In some embodiments, the SNN for the prior subtask ((p−1)-th subtask) receives inputs describing a subtask state (e.g., a subtask initial state or a subtask non-terminal state) of the prior subtask ((p−1)-th subtask), and outputs an action selection policy of the execution device in the subtask state of the prior subtask ((p-1)-th subtask). In some embodiments, the inputs describing a subtask state of the prior subtask ((p−1)-th subtask) can comprise a sequence of actions taken by the execution device and by the one or more other devices that reach a subtask of the prior subtask ((p−1)-th subtask). In some embodiments, the inputs to the SNN can further comprise private information of the execution device (e.g., private cards of the player in HUNL).

In some embodiments, in training the SNN for the prior subtask ((p−1)-th subtask) based on the VNN for the specified subtask (p-th subtask), a plurality of rewards in the plurality of subtask initial states of the specified subtask (p-th subtask) are predicted or determined based on an output of the VNN for the specified subtask (p-th subtask). The plurality of rewards in the plurality of subtask initial states of the specified subtask (p-th subtask) are the plurality of rewards in the plurality of subtask terminal states of the prior subtask ((p−1)-th subtask). Based on the plurality of rewards in the plurality of subtask terminal states of the prior subtask ((p−1)-th subtask), the SNN for the prior subtask ((p−1)-th subtask) can be trained, for example, according to a neural-network-based CFR algorithm (e.g., the double neural CFR algorithm).

In some embodiments, the neural-network-based CFR algorithm may require a plurality of iterations (e.g., in the order of $10^3$ or more) to converge. As such, the SNN can be trained over the plurality of iterations of the neural-network-based CFR algorithm. The neural-network-based CFR algorithm can use at least one neural network to learn strategies of different subtask states of the subtask over the iterations of the CFR algorithm.

In some embodiments, training the SNN for the prior subtask ((p−1)-th subtask) based on the VNN for the specified subtask is performed in response to determining that a complexity of the prior subtask exceeds a threshold. In some embodiments, if the complexity of the prior subtask does not exceeds a threshold, the step 460 can be skipped for the prior subtask. In some embodiments, a tabular CFR algorithm can be performed to generate an action selection policy for the prior subtask.

In some embodiments, an action selection policy for completing the prior subtask ((p−1)-th subtask) can be determined based on outputs generated by the SNN for the prior subtask ((p−1)-th subtask). The trained SNN for the prior subtask ((p−1)-th subtask) can receive an input comprising data representing a subtask initial state of the prior subtask ((p-1)-th subtask), and output an action selection policy of the execution device in the subtask initial state of the prior subtask ((p−1)-th subtask). Based on the output action selection policy of the execution device in the subtask initial state of the prior subtask ((p−1)-th subtask), the execution device can select an action and move to a next subtask state (e.g., a subtask non-terminal state) of the prior subtask ((p−1)-th subtask). The trained SNN for the prior subtask ((p−1)-th subtask) can predict an action selection policy of the execution device in the next subtask state of the prior subtask ((p−1)-th subtask). The process can continue until the execution device reaches a subtask terminal state of the prior subtask ((p−1)-th subtask). Accordingly, an action selection policy for completing the prior subtask ((p−1)-th subtask) can be determined.

In some embodiments, operations of the execution device in the prior subtask ((p−1)-th subtask) are controlled according to the action selection policy for completing the prior subtask ((p−1)-th subtask). In some embodiments, the action selection policy can serve as an output of the software-implemented application to automatically control the execution device's action at each state, for example, by selecting the action that has the highest probability among a plurality of possible actions based on the action selection policy. As an example, the environment comprises a traffic routing environment, the execution device supported by the application comprises a computer-assisted vehicle, the action selection policy comprises a route selection policy for controlling directions of the computer-assisted vehicle, and controlling operations of the execution device according to the action selection policy comprises controlling directions of the computer-assisted vehicle according to the route selection policy. Controlling operations of the computer-assisted vehicle may include controlling one or more of a throttle, steering, braking, navigation, engine mode to achieve directions, speeds, other parameters specified in the route selection policy that is generated according to the process 400 to complete the task of, for example, reaching a desired destination in the environment that includes other computer-assisted vehicles sharing roads.

At 470, whether the specified subtask reaches the first subtask (e.g., corresponding to the top or first phase of the game tree) is determined, i.e., whether p equals 1 is determined. The first subtask (e.g., corresponding to Phase 1 211 of the game tree 205) includes the initial state of the task (e.g., the root node 201 of the game tree 205 of FIG. 2). If the specified subtask reaches the first subtask in the sequence of subtasks (e.g., p=1), the process 400 terminates at 480. If not, the process 400 proceeds to 490, where p=p−1, the specified subtask is replaced with the prior subtask that immediately precedes the specified subtask in the sequence of subtasks. For 490, the process 400 goes back to 430 to determine rewards of the execution device in subtask terminal states of the specified subtask (p-th subtask). Now the specified subtask (p-th subtask) is no longer the last subtask (i.e., N-th subtask) in the sequence of N subtasks.

For example, the specified subtask can be the second last subtask (i.e., (N−1)-th subtask, p=N−1) in the sequence of the subtasks. The rewards of the execution device in subtask terminal states of the specified subtask ((N−1)-th subtask) are rewards of the execution device in subtask initial states of a next subtask ((p+1)-th subtask, i.e., N-th subtask) that immediately follows the specified subtask ((N−1)-th subtask) in the sequence of N subtasks. The rewards of the execution device in subtask initial states of the next subtask (N-th subtask) can be determined, for example, based on the VNN for the next subtask (N-th subtask) as described w.r.t. 450 in the previous iteration. For 430, the process 400 proceeds to 440 to train a VNN for the specified subtask (p-th subtask, i.e., (N−1)-th subtask) based on the rewards of the execution device in the subtask terminal states of the specified subtask (i.e., (N−1)-th subtask). The process 400 can continue as described above until it ends at 480.

In some embodiments, the step 460 of training the SNN for the prior subtask ((p−1)-th subtask) can be performed after the VNNs for all the subtasks in the sequence of subtasks are trained, or at another time once the VNN for the specified subtask (p-th subtask) is trained. In some embodiments, training another SNN for another subtask (e.g., (q−1)-th subtask, q p) in the sequence of subtasks based on a VNN for a subtask (e.g., q-th subtask) that follows the another subtask in the sequence of subtasks, wherein the training the another SNN for the another subtask (e.g., (q−1)-th subtask) is performed independently from the training the SNN for the prior subtask ((p−1)-th subtask). In some embodiments, two or more SNNs for respective subtasks can be trained in parallel.

Figure 5:
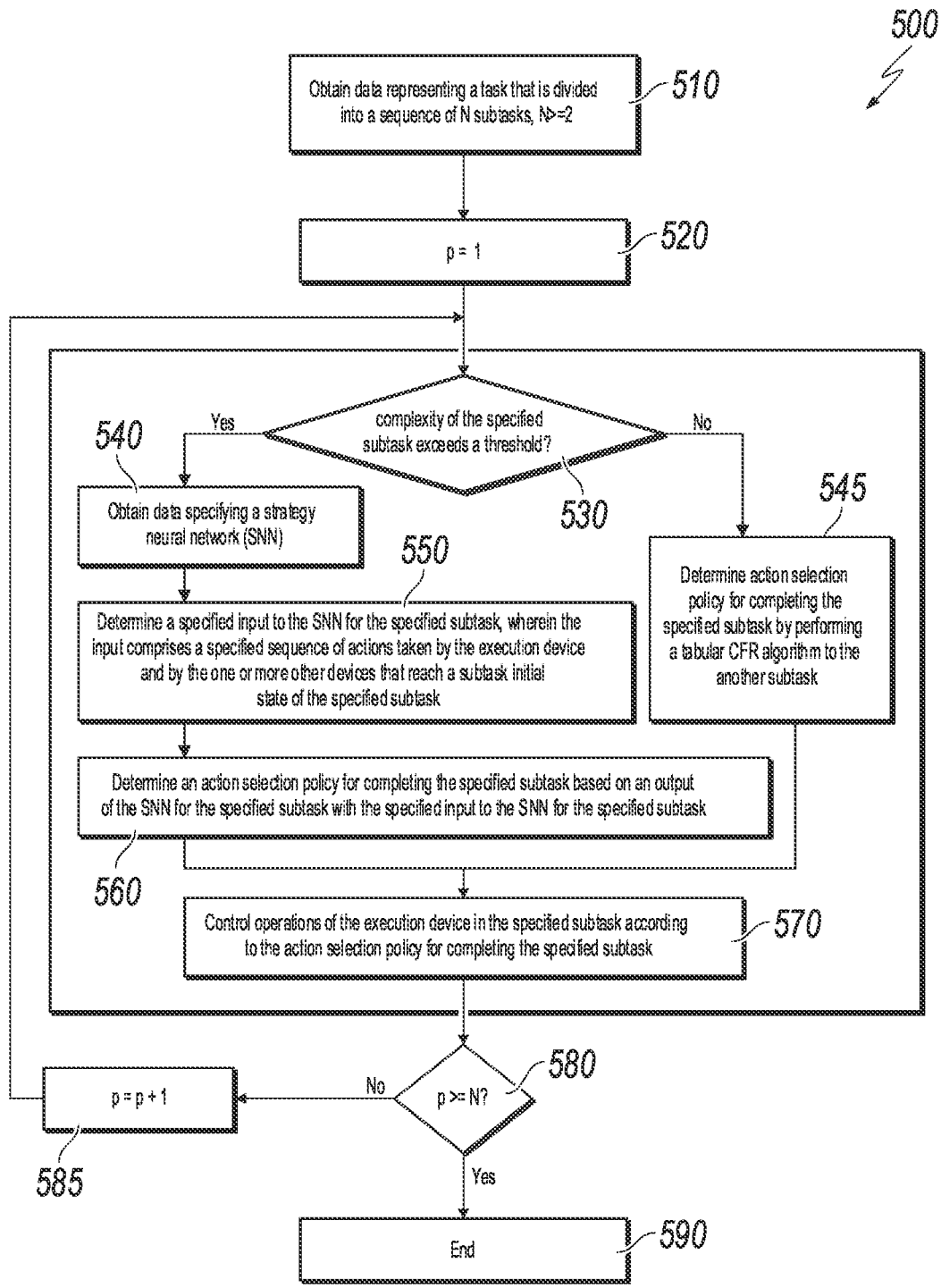
FIG. 5 is a flowchart of another example of a process for generating an action selection policy for causing an execution device to complete a task in an environment that includes the execution device and one or more other devices, in accordance with embodiments of this specification.

FIG. 5 is a flowchart of an example of a process 500 for generating an action selection policy causing an execution device to complete a task in an environment that includes the execution device and one or more other devices, in accordance with embodiments of this specification. The process 500 can be performed, for example, by the AI subsystem 210 in performing some or all operations of the process 300 for solving the large or VLS IIG. The process 500 can be performed, for example, in an interference or application stage for generating the action selection policy causing the execution device to complete the task. For example, the process 500 use a trained strategy neural network (SNN) to predict an action selection plan for a specified subtask of the task, wherein the SNN can be trained based on outputs from a value neural network (VNN) that estimate intermediate rewards of terminal nodes of the specified subtask of the task.

The example process 500 shown in FIG. 5 can be modified or reconfigured to include additional, fewer, or different operations, which can be performed in the order shown or in a different order. In some instances, one or more of the operations can be repeated or iterated, for example, until a terminating condition is reached. In some implementations, one or more of the individual operations shown in FIG. 5 can be executed as multiple separate operations, or one or more subsets of the operations shown in FIG. 5 can be combined and executed as a single operation.

In some embodiments, the process 500 can be performed in an iterative manner, for example, by performing two or more iterations. In some embodiments, the process 500 can be used in automatic control, robotics, or any other applications that involve action selections. In some embodiments, the process 500 can be performed by an execution device for generating an action selection policy (e.g., a strategy) for completing a task (e.g., finding Nash equilibrium of real-world large scenarios represented by a large or VLS IIG) in an environment that includes the execution device and one or more other devices. The execution device can perform the process 500 in the environment for controlling operations of the execution device according to the action selection policy.

In some embodiments, the execution device can include a data processing apparatus such as a system of one or more computers, located in one or more locations, and programmed appropriately in accordance with this specification. For example, the AI subsystem 210 of FIG. 2 or a computer system 800 of FIG. 8, appropriately programmed, can perform the process 500. The execution device can be associated with an execution party or player (e.g., the AI subsystem 210 of FIG. 2). The execution party or player and one or more other parties (e.g., the human players 290 of FIG. 2 associated with the one or more other devices) can be participants or players in an environment, for example, for strategy searching in strategic interaction between the execution party and one or more other parties.

In some embodiments, the environment can be modeled by an imperfect information game (IIG) that involves two or more players. In some embodiments, the process 500 can be performed to solve a large or VLS IIG, for example, by the execution party supported by a computer-implemented application. The large or VLS IIG can represent one or more real-world scenarios such as resource allocation, product/service recommendation, cyber-attack prediction and/or prevention, traffic routing, fraud management, etc., that involve two or more parties, where each party may have incomplete or imperfect information about the other party's decisions. As an example, the IIG can represent a collaborative product-service recommendation service that involves at least a first player and a second player. The first player may be, for example, an online retailer that has customer (or user) information, product and service information, purchase history of the customers, etc. The second player can be, for example, a social network platform that has social networking data of the customers, a bank or another financial institution that has financial information of the customers, a car dealership, or any other party that may have information of the customers on the customers' preferences, needs, financial situations, locations, etc. in predicting and recommending products and services to the customers. The first player and the second player may each have proprietary data that the player does not want to share with others. The second player may only provide partial information to the first player at different times. As such, the first player may only have limited access to the information of the second player. In some embodiments, the process 500 can be performed for making a recommendation to a party with the limited information of the second party, planning a route with limited information.

At 510, data representing a task that is divided into a sequence of N subtasks are obtained. The data can be the same as the data described w.r.t. 410.

In some embodiments, the process 500 can be used for generating an action selection policy based on trained SNN as described in process 400, for example, in real time. The process 500 can proceed sequentially in an order of the sequence of N subtask (i.e., from the top to bottom of the game tree representing the task). For example, as shown in FIG. 2, the process 500 can proceed sequentially starting from the top phase, Phase 1 211, . . . , Phase p, Phase N-2, 215, Phase N-1 217 to the bottom or last phase, Phase N 219 of the game tree 205.

A current subtask is specified as the p-th subtask, 1<=p<=N. At 520, let p=1, and the process 500 starts from a first subtask (i.e., 1st subtask) in the sequence of N subtasks. The first subtask can correspond to the first phase of a game tree (e.g., Phase 1 211 of the game tree 205).

At 530, whether a complexity of the specified subtask exceeds a threshold can be determined, for example, according to the example techniques described w.r.t. FIG. 3. The complexity of a specified subtask can be measured, for example, by a complexity of a state-space complexity, a game tree size, or another complexity measure of a game.

For example, the complexity of a specified subtask can be measured by a width of the specified phase of the game tree.

If the complexity of the specified phase exceeds the threshold, the process 500 proceeds to 540. If the complexity of the specified phase does not exceed the threshold, the process 500 proceeds to 545.

At 540, data specifying a strategy neural network (SNN) for a specified subtask in the sequence of subtasks are obtained. The SNN for the specified subtask receives inputs comprising a sequence of actions taken by the execution device and by the one or more other devices that reach a subtask initial state of the specified subtask, and predicts an action selection policy of the execution device for the specified subtask. In some embodiments, the SNN for the specified subtask is trained based on a value neural network (VNN) for a next subtask that follows the specified subtask in the sequence of subtasks, for example, according to the techniques described w.r.t. FIG. 4. The VNN for the next subtask receives inputs comprising reach probabilities of the execution device and the one or more other devices reaching a subtask initial state of the next subtask, and predicts a reward of the execution device in the subtask initial state of the next subtask. After 540, the process 500 proceeds to 550.

At 550, an input to the SNN for the specified subtask can be determined. In some embodiments, the input can include a specified sequence of actions (e.g., action history 203) taken by the execution device and by the one or more other devices that reach a subtask initial state of the specified subtask (e.g., public state 208 at the root node 231 of Phase N−1 217). In some embodiments, the subtask initial state of the specified subtask can be one of multiple subtask initial states of the specified subtask, if the specified subtask is not the first subtask. In some embodiments, the subtask initial state of the specified subtask can be a subtask terminal state of a prior subtask that precedes the specified subtask in the sequence of the subtasks, for example, determined based on an output of a SNN for the prior subtask. In some embodiments, the specified sequence of actions can include a sequence of actions taken by the execution device and by the one or more other devices that reach the subtask initial state of the specified subtask from the task initial state, which is determined based on outputs of one or more respective SNNs for one or more subtask that precede the specified subtask in the sequence of subtasks. In some embodiments, the input can also include private information of the execution device (e.g., private cards of the player in HUNL). After 550, the process 500 proceeds to 560.

At 560, an action selection policy for completing the specified subtask is determined based on an output of the SNN for the specified subtask with the specified input to the SNN for the specified subtask. The trained SNN for the specified subtask can receive an input comprising data representing a subtask initial state of the specified subtask, and output an action selection policy of the execution device in the subtask initial state of the specified subtask. Based on the output action selection policy of the execution device in the subtask initial state of the specified subtask, the execution device can select an action and move to a next subtask state (e.g., a subtask non-terminal state) of the specified subtask. The trained SNN for the specified subtask can predict an action selection policy of the execution device in the next subtask state of the specified subtask. The process can continue until the execution device reaches a subtask terminal state of the specified subtask. Accordingly, an action selection policy for completing the specified subtask can be determined. After 560, the process 500 proceeds to 570.

At 545, in response to determining that the specified phase (e.g., another subtask (q−1)-th subtask, q p) in the sequence of subtasks that has a complexity not exceeding the threshold, an action selection policy for completing the specified phase can be determined by performing a CFR algorithm (e.g., a tabular CFR algorithm).

At 570, operations of the execution device in the specified subtask are controlled according to the action selection policy for completing the specified subtask. In some embodiments, the action selection policy can serve as an output of the software-implemented application to automatically control the execution device's action at each state, for example, by selecting the action that has the highest probability among a plurality of possible actions based on the action selection policy. As an example, the environment comprises a traffic routing environment, the execution device supported by the application comprises a computer-assisted vehicle, the action selection policy comprises a route selection policy for controlling directions of the computer-assisted vehicle, and controlling operations of the execution device according to the action selection policy comprises controlling directions of the computer-assisted vehicle according to the route selection policy. Controlling operations of the computer-assisted vehicle may include controlling one or more of a throttle, steering, braking, navigation, engine mode to achieve directions, speeds, other parameters specified in the route selection policy that is generated according to the process 500 to complete the task of, for example, reaching a desired destination in the environment that includes other computer-assisted vehicles sharing roads. After 570, the process 500 proceeds to 580.

At 580, whether the specified subtask reaches a last subtask (e.g., corresponding to the bottom or last phase of the game tree) is determined, i.e., whether p equals or exceeds N is determined. The last subtask (e.g., corresponding to Phase N 219 of the game tree 205) includes the terminal state of the task (e.g., the terminal node 209 of the game tree 205 of FIG. 2). If the specified subtask reaches the terminal subtask in the sequence of subtasks (e.g., p N), the process 500 terminates at 590. If not, the process 500 proceeds to 585, where p=p+1, the specified subtask is replaced with the next subtask that immediately follows the specified subtask in the sequence of subtasks. For 585, the process 500 goes back to 530.

For example, in another iteration of the process 500, another SNN for another subtask (e.g., q-th subtask, q p) in the sequence of subtasks can be obtained at 540, for example, in response to determining that the another subtask has a complexity exceeding the threshold at 530. The another subtask (e.g., q-th subtask) is behind the specified subtask (e.g., p-th subtask) in the sequence of subtasks (e.g., q>p). The another SNN for the another subtask (e.g., q-th subtask) is trained independently from the SNN for the specified subtask (e.g., p-th subtask) in this iteration of the process 500. At 550, another input to the another SNN for the another subtask can be determined. In some embodiments, the another input can include another sequence of actions taken by the execution device and by the one or more other devices that reach a subtask initial state of the another subtask (e.g., q-th subtask). In some embodiments, as the another SNN for the another subtask (e.g., q-th subtask) is behind the specified subtask (e.g., p-th subtask), the another sequence of actions input into the another SNN for the another subtask (e.g., q-th subtask) can include the sequence of actions input into the SNN for the specified subtask (e.g., p-th subtask). At 560, another action selection policy for completing the another subtask (e.g., q-th subtask) is determined based on the another output of the another SNN for the another subtask (e.g., q-th subtask) with the another input to the another SNN for the another subtask (e.g., q-th subtask).

The process 500 can continue until it terminates at 590. In some embodiments, an overall action selection policy for completing the task can be determined by determining a respective action selection policy for each of the sequence of subtasks according to an order of the sequence of subtasks from a first subtask that comprises the task initial state to a last subtask that comprises the plurality of task terminal states. In some embodiments, the overall action selection policy for completing the task can be determined by concatenating or otherwise combining the respective action selection policy for each of the sequence of subtasks according to the order of the sequence of subtasks.

Figure 6:
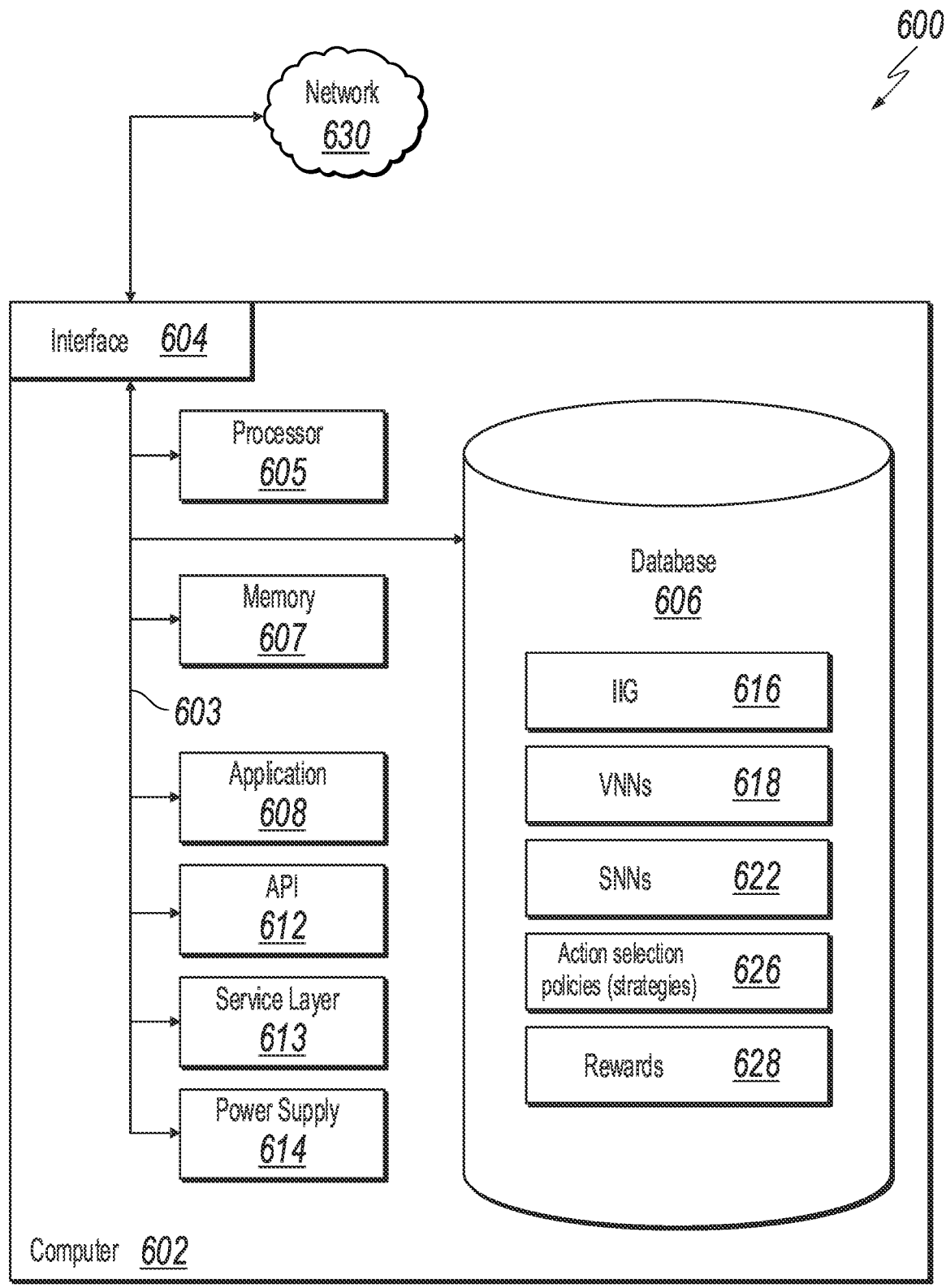
FIG. 6 depicts a block diagram illustrating an example of a computer-implemented system used to provide computational functionalities associated with described algorithms, methods, functions, processes, flows, and procedures in accordance with embodiments of this specification.

FIG. 6 depicts a block diagram illustrating an example of a computer-implemented system used to provide computational functionalities associated with described algorithms, methods, functions, processes, flows, and procedures in accordance with embodiments of this specification. FIG. 6 is a block diagram illustrating an example of a computer-implemented System 600 used to provide computational functionalities associated with described algorithms, methods, functions, processes, flows, and procedures, according to an embodiment of the present disclosure. In the illustrated embodiment, System 600 includes a Computer 602 and a Network 630.

The illustrated Computer 602 is intended to encompass any computing device such as a server, desktop computer, laptop/notebook computer, wireless data port, smart phone, personal data assistant (PDA), tablet computer, one or more processors within these devices, another computing device, or a combination of computing devices, including physical or virtual instances of the computing device, or a combination of physical or virtual instances of the computing device. Additionally, the Computer 602 can include an input device, such as a keypad, keyboard, touch screen, another input device, or a combination of input devices that can accept user information, and an output device that conveys information associated with the operation of the Computer 602, including digital data, visual, audio, another type of information, or a combination of types of information, on a graphical-type user interface (UI) (or GUI) or other UI.

The Computer 602 can serve in a role in a distributed computing system as a client, network component, a server, a database or another persistency, another role, or a combination of roles for performing the subject matter described in the present disclosure. The illustrated Computer 602 is communicably coupled with a Network 630. In some embodiments, one or more components of the Computer 602 can be configured to operate within an environment, including cloud-computing-based, local, global, another environment, or a combination of environments.

At a high level, the Computer 602 is an electronic computing device operable to receive, transmit, process, store, or manage data and information associated with the described subject matter. According to some embodiments, the Computer 602 can also include or be communicably coupled with a server, including an application server, e-mail server, web server, caching server, streaming data server, another server, or a combination of servers.

The Computer 602 can receive requests over Network 630 (for example, from a client software application executing on another Computer 602) and respond to the received requests by processing the received requests using a software application or a combination of software applications.

In addition, requests can also be sent to the Computer 602 from internal users (for example, from a command console or by another internal access method), external or third-parties, or other entities, individuals, systems, or computers.

Each of the components of the Computer 602 can communicate using a System Bus 603. In some embodiments, any or all of the components of the Computer 602, including hardware, software, or a combination of hardware and software, can interface over the System Bus 603 using an application programming interface (API) 612, a Service Layer 613, or a combination of the API 612 and Service Layer 613. The API 612 can include specifications for routines, data structures, and object classes. The API 612 can be either computer-language independent or dependent and refer to a complete interface, a single function, or even a set of APIs. The Service Layer 613 provides software services to the Computer 602 or other components (whether illustrated or not) that are communicably coupled to the Computer 602. The functionality of the Computer 602 can be accessible for all service consumers using the Service Layer 613. Software services, such as those provided by the Service Layer 613, provide reusable, defined functionalities through a defined interface. For example, the interface can be software written in JAVA, C++, another computing language, or a combination of computing languages providing data in extensible markup language (XML) format, another format, or a combination of formats. While illustrated as an integrated component of the Computer 602, alternative embodiments can illustrate the API 612 or the Service Layer 613 as stand-alone components in relation to other components of the Computer 602 or other components (whether illustrated or not) that are communicably coupled to the Computer 602. Moreover, any or all parts of the API 612 or the Service Layer 613 can be implemented as a child or a sub-module of another software module, enterprise application, or hardware module without departing from the scope of the present disclosure.

The Computer 602 includes an Interface 604. Although illustrated as a single Interface 604, two or more Interfaces 604 can be used according to particular needs, desires, or particular embodiments of the Computer 602. The Interface 604 is used by the Computer 602 for communicating with another computing system (whether illustrated or not) that is communicatively linked to the Network 630 in a distributed environment. Generally, the Interface 604 is operable to communicate with the Network 630 and includes logic encoded in software, hardware, or a combination of software and hardware. More specifically, the Interface 604 can include software supporting one or more communication protocols associated with communications such that the Network 630 or hardware of Interface 604 is operable to communicate physical signals within and outside of the illustrated Computer 602.

The Computer 602 includes a Processor 605. Although illustrated as a single Processor 605, two or more Processors 605 can be used according to particular needs, desires, or particular embodiments of the Computer 602. Generally, the Processor 605 executes instructions and manipulates data to perform the operations of the Computer 602 and any algorithms, methods, functions, processes, flows, and procedures as described in the present disclosure.

The Computer 602 also includes a Database 606 that can hold data for the Computer 602, another component communicatively linked to the Network 630 (whether illustrated or not), or a combination of the Computer 602 and another component. For example, Database 606 can be an in-memory, conventional, or another type of database storing data consistent with the present disclosure. In some embodiments, Database 606 can be a combination of two or more different database types (for example, a hybrid in-memory and conventional database) according to particular needs, desires, or particular embodiments of the Computer 602 and the described functionality. Although illustrated as a single Database 606, two or more databases of similar or differing types can be used according to particular needs, desires, or particular embodiments of the Computer 602 and the described functionality. While Database 606 is illustrated as an integral component of the Computer 602, in alternative embodiments, Database 606 can be external to the Computer 602. As an example, Database 606 can include the above-described data specifying an IIG that is divided into multiple phases 616, one or more VNNs 618 for one or more phases of the IIG, one or more SNNs 622 for one or more phases of the IIG, one or more action selection policies (strategies) 626 for one or more phases of the IIG, and rewards (including intermediate rewards) 628 in terminal states of one or more phases of an IIG.

The Computer 602 also includes a Memory 607 that can hold data for the Computer 602, another component or components communicatively linked to the Network 630 (whether illustrated or not), or a combination of the Computer 602 and another component. Memory 607 can store any data consistent with the present disclosure. In some embodiments, Memory 607 can be a combination of two or more different types of memory (for example, a combination of semiconductor and magnetic storage) according to particular needs, desires, or particular embodiments of the Computer 602 and the described functionality. Although illustrated as a single Memory 607, two or more Memories 607 or similar or differing types can be used according to particular needs, desires, or particular embodiments of the Computer 602 and the described functionality. While Memory 607 is illustrated as an integral component of the Computer 602, in alternative embodiments, Memory 607 can be external to the Computer 602.

The Application 608 is an algorithmic software engine providing functionality according to particular needs, desires, or particular embodiments of the Computer 602, particularly with respect to functionality described in the present disclosure. For example, Application 608 can serve as one or more components, modules, or applications. Further, although illustrated as a single Application 608, the Application 608 can be implemented as multiple Applications 608 on the Computer 602. In addition, although illustrated as integral to the Computer 602, in alternative embodiments, the Application 608 can be external to the Computer 602.

The Computer 602 can also include a Power Supply 614. The Power Supply 614 can include a rechargeable or non-rechargeable battery that can be configured to be either user- or non-user-replaceable. In some embodiments, the Power Supply 614 can include power-conversion or management circuits (including recharging, standby, or another power management functionality). In some embodiments, the Power Supply 614 can include a power plug to allow the Computer 602 to be plugged into a wall socket or another power source to, for example, power the Computer 602 or recharge a rechargeable battery.

There can be any number of Computers 602 associated with, or external to, a computer system containing Computer 602, each Computer 602 communicating over Network 630. Further, the term "client," "user," or other appropriate terminology can be used interchangeably, as appropriate, without departing from the scope of the present disclosure. Moreover, the present disclosure contemplates that many users can use one Computer 602, or that one user can use multiple computers 602.

Figure 7:
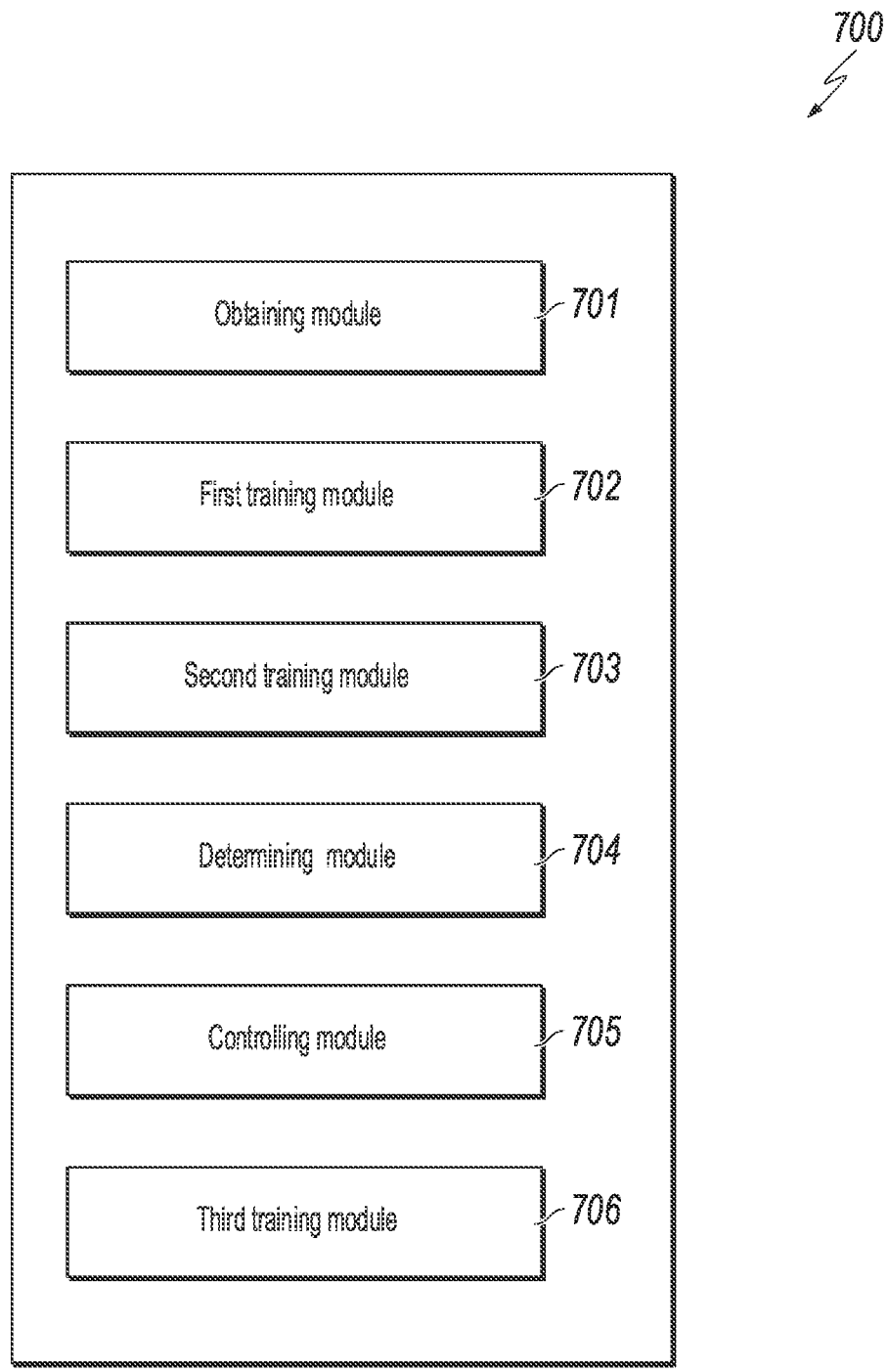
FIG. 7 depicts examples of modules of an apparatus in accordance with embodiments of this specification.

FIG. 7 is a diagram of an example of modules of an apparatus 700 in accordance with embodiments of this specification. The apparatus 700 can be an example embodiment of a data processing apparatus or an execution device for generating an action selection policy for causing an execution device to complete a task in an environment that includes the execution device and one or more other devices. The apparatus 700 can correspond to the embodiments described above, and the apparatus 700 includes the following: an obtaining module 701 for obtaining data representing a task that is divided into a sequence of subtasks, wherein the task comprises a task initial state, a plurality of non-task-terminal states, and a plurality of task terminal states, wherein each of the task terminal states results from a sequence of actions taken by the execution device and by the one or more other devices in a subset of the plurality of non-task-terminal states, and the plurality of the task terminal states have respective rewards in the task terminal states, each subtask in the sequence of subtasks comprises one or more subtask initial states and a plurality of subtask terminal states of the subtask, and except for a last subtask in the sequence of subtasks, the plurality of subtask terminal states of the subtask are a plurality of subtask initial states of a next subtask that follows the subtask in the sequence of subtasks, for a specified subtask in the sequence of subtasks except for a first subtask in the sequence of subtasks, a first training module 702 for training a value neural network (VNN) for the specified subtask, wherein the VNN for the specified subtask receives inputs comprising reach probabilities of the execution device and the one or more other devices reaching a subtask initial state of the specified subtask, and predicts a reward of the execution device in the subtask initial state of the specified subtask; a second training module 703 for training a strategy neural network (SNN) for a prior subtask that precedes the specified subtask in the sequence of the subtasks based on the VNN for the specified subtask, wherein the SNN for the prior subtask receives inputs comprising and sequence of actions taken by the execution device and by the one or more other devices that reach a subtask state of the prior subtask, and predicts an action selection policy of the execution device in the subtask state of the prior subtask.

In some embodiments, the apparatus 700 further includes the following: a determining module 704 for determining an action selection policy for completing the prior subtask based on an output generated by the SNN for the prior subtask; and a controlling module 705 for controlling operations of the execution device in the prior subtask according to the action selection policy for completing the prior subtask.

In some embodiments, wherein training the VNN for the specified subtask comprises training the VNN for the specified subtask using an output from a VNN for a next subtask that follows the specified subtask in the sequence of subtasks, wherein the VNN for the next subtask receives inputs comprising reach probabilities of the execution device and the one or more other devices reaching a subtask initial state of the next subtask, and the output from the VNN for the next subtask comprises a reward of the execution device in the subtask initial state of the next subtask.

In some embodiments, wherein training a value neural network (VNN) for the specified subtask comprises: obtaining a plurality of sample inputs to the VNN for the specified subtask, wherein each of the plurality of sample inputs comprises: public information of the execution device and the one or more other devices reaching a subtask initial state of the specified subtask; the reach probabilities of the execution device and the one or more other devices reaching a subtask initial state of the specified subtask; for the each of the plurality of sample inputs, calculating a sample reward of the execution device in the subtask initial state of the specified subtask by performing a CFR algorithm; an training the VNN for the specified subtask based on the each of the plurality of sample inputs and the sample reward of the execution device in the subtask initial state of the specified subtask.

In some embodiments, wherein training the SNN for the prior subtask based on the VNN for the specified subtask comprises: predicting a plurality of rewards in the plurality of subtask terminal states of the prior subtask based on an output of the VNN for the specified subtask; and training the SNN for the prior subtask based on the plurality of rewards in the plurality of subtask terminal states of the prior subtask according to a neural-network-based CFR algorithm.

In some embodiments, the apparatus 700 further includes the following: a third training module 706 for training another strategy neural network (SNN) for another subtask in the sequence of subtasks based on a VNN for a subtask that follows the another subtask in the sequence of subtasks, wherein the training the another SNN for the another subtask is performed independently from the training the SNN for the prior subtask.

In some embodiments, wherein training the SNN for the prior subtask based on the VNN for the specified subtask is performed in response to determining that a complexity of the prior subtask exceeds a threshold.

Figure 8:
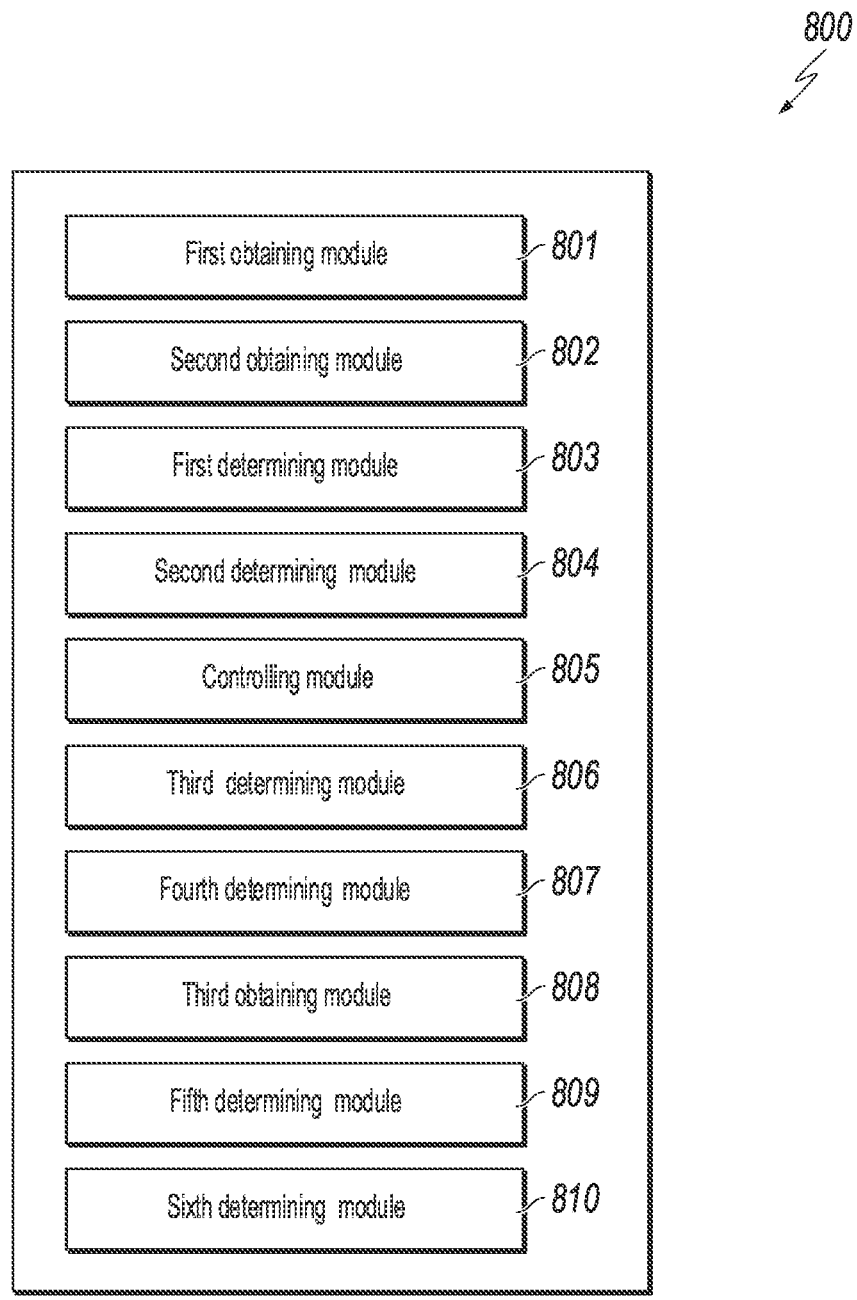
FIG. 8 depicts examples of modules of another apparatus in accordance with embodiments of this specification.

FIG. 8 is a diagram of an example of modules of an apparatus 800 in accordance with embodiments of this specification. The apparatus 800 can be an example embodiment of a data processing apparatus or an execution device for generating an action selection policy causing an execution device to complete a task in an environment that includes the execution device and one or more other devices. The apparatus 800 can correspond to the embodiments described above, and the apparatus 800 includes the following: a first obtaining module 801 for obtaining data representing a task that is divided into a sequence of subtasks, wherein: the task comprises a task initial state, a plurality of non-task-terminal states, and a plurality of task terminal states, wherein each of the task terminal states results from a sequence of actions taken by the execution device and by the one or more other devices in a subset of the plurality of non-task-terminal states, and the plurality of the task terminal states have respective rewards in the task terminal states, each subtask in the sequence of subtasks comprises one or more subtask initial states and a plurality of subtask terminal states of the subtask, and except for a last subtask in the sequence of subtasks, the plurality of subtask terminal states of the subtask are a plurality of subtask initial states of a next subtask that follows the subtask in the sequence of subtasks, a second obtaining module 802 for obtaining data specifying a strategy neural network (SNN) for a specified subtask in the sequence of subtasks, wherein the SNN for the specified subtask receives inputs comprising a sequence of actions taken by the execution device and by the one or more other devices that reach a subtask initial state of the specified subtask, and predicts an action selection policy of the execution device for the specified subtask, wherein the SNN for the specified subtask is trained based on a value neural network (VNN) for a next subtask that follows the specified subtask in the sequence of subtasks, wherein the VNN for the next subtask receives inputs comprising reach probabilities of the execution device and the one or more other devices reaching a subtask initial state of the next subtask, and predicts a reward of the execution device in the subtask initial state of the next subtask; a first determining module 803 for determining a specified input to the SNN for the specified subtask, wherein the specified input comprises a specified sequence of actions taken by the execution device and by the one or more other devices that reach a subtask initial state of the specified subtask; and a second determining module 804 for determining an action selection policy for completing the specified subtask based on an output of the SNN for the specified subtask with the specified input to the SNN for the specified subtask.

In some embodiments, the apparatus 800 further includes the following: a controlling module 805 for controlling operations of the execution device in the specified subtask according to the action selection policy for completing the specified subtask.

In some embodiments, wherein the specified subtask has a complexity that exceeds a threshold.

In some embodiments, the apparatus 800 further includes the following: a third determining module 806 for determining another subtask in the sequence of subtasks that has a complexity below a threshold; and a fourth determining module 807 for determining another action selection policy for completing the another subtask by performing a tabular CFR algorithm to the another subtask.

In some embodiments, the apparatus 800 further includes the following: a third obtaining module 808 for obtaining another SNN for another subtask in the sequence of subtasks that has a complexity exceeding a threshold, wherein the another subtask is behind the specified subtask in the sequence of subtasks, and the another SNN for the another subtask is trained independently from the SNN for the specified subtask; and a fifth determining module 809 for determining another action selection policy for completing the another subtask by inputting, into the another SNN for the another subtask, another sequence of actions taken by the execution device and by the one or more other devices that reach an initial state of the another subtask from the task initial state, wherein the another sequence of actions comprises the sequence of actions.

In some embodiments, the apparatus 800 further includes the following: a sixth determining module 810 for determining an overall action selection policy for completing the task by determining a respective action selection policy for each of the subtask according to an order of the sequence of subtasks from a first subtask that comprises the task initial state to a last subtask that comprises the plurality of task terminal states.

The system, apparatus, module, or unit illustrated in the previous embodiments can be implemented by using a computer chip or an entity, or can be implemented by using a product having a certain function. A typical embodiment device is a computer, and the computer can be a personal computer, a laptop computer, a cellular phone, a camera phone, a smartphone, a personal digital assistant, a media player, a navigation device, an email receiving and sending device, a game console, a tablet computer, a wearable device, or any combination of these devices.

For an embodiment process of functions and roles of each module in the apparatus, references can be made to an embodiment process of corresponding steps in the previous method. Details are omitted here for simplicity.

Because an apparatus embodiment basically corresponds to a method embodiment, for related parts, references can be made to related descriptions in the method embodiment. The previously described apparatus embodiment is merely an example. The modules described as separate parts may or may not be physically separate, and parts displayed as modules may or may not be physical modules, may be located in one position, or may be distributed on a number of network modules. Some or all of the modules can be selected based on actual demands to achieve the objectives of the solutions of the specification. A person of ordinary skill in the art can understand and implement the embodiments of the present application without creative efforts.

Referring again to FIGS. 7-8, each of the figures can be interpreted as illustrating an internal functional module and a structure of a data processing apparatus or an execution device for generating an action selection policy for completing a task in an environment that includes the execution device and one or more other devices. An execution body in essence can be an electronic device, and the electronic device includes the following: one or more processors; and one or more computer-readable memories configured to store an executable instruction of the one or more processors. In some embodiments, the one or more computer-readable memories are coupled to the one or more processors and have programming instructions stored thereon that are executable by the one or more processors to perform algorithms, methods, functions, processes, flows, and procedures, as described in this specification. This specification also provides one or more non-transitory computer-readable storage media coupled to one or more processors and having instructions stored thereon which, when executed by the one or more processors, cause the one or more processors to perform operations in accordance with embodiments of the methods provided herein.

This specification further provides a system for implementing the methods provided herein. The system includes one or more processors, and a computer-readable storage medium coupled to the one or more processors having instructions stored thereon which, when executed by the one or more processors, cause the one or more processors to perform operations in accordance with embodiments of the methods provided herein.

Embodiments of the subject matter and the actions and operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, e.g., one or more modules of computer program instructions, encoded on a computer program carrier, for execution by, or to control the operation of, data processing apparatus. For example, a computer program carrier can include one or more computer-readable storage media that have instructions encoded or stored thereon. The carrier may be a tangible non-transitory computer-readable medium, such as a magnetic, magneto optical, or optical disk, a solid state drive, a random access memory (RAM), a read-only memory (ROM), or other types of media. Alternatively, or in addition, the carrier may be an artificially generated propagated signal, e.g., a machine-generated electrical, optical, or electromagnetic signal that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

A computer program, which may also be referred to or described as a program, software, a software application, an app, a module, a software module, an engine, a script, or code, can be written in any form of programming language, including compiled or interpreted languages, or declarative or procedural languages; and it can be deployed in any form, including as a stand-alone program or as a module, component, engine, subroutine, or other unit suitable for executing in a computing environment, which environment may include one or more computers interconnected by a data communication network in one or more locations.

A computer program may, but need not, correspond to a file in a file system. A computer program can be stored in a portion of a file that holds other programs or data, e.g., one or more scripts stored in a markup language document, in a single file dedicated to the program in question, or in multiple coordinated files, e.g., files that store one or more modules, sub programs, or portions of code.

Processors for execution of a computer program include, by way of example, both general- and special-purpose microprocessors, and any one or more processors of any kind of digital computer. Generally, a processor will receive the instructions of the computer program for execution as well as data from a non-transitory computer-readable medium coupled to the processor.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring substantially simultaneously. For example, the time difference for a response to display (or for an initiation of a display) of data following the individual's action to access the data may be less than 1 ms, less than 1 sec., or less than 5 secs. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The term "data processing apparatus" encompasses all kinds of apparatuses, devices, and machines for processing data, including by way of example a programmable processor, a computer, or multiple processors or computers. Data processing apparatus can include special-purpose logic circuitry, e.g., an FPGA (field programmable gate array), an ASIC (application specific integrated circuit), or a GPU (graphics processing unit). The apparatus can also include, in addition to hardware, code that creates an execution environment for computer programs, e.g., code that constitutes processor firmware, a protocol stack, a database management system, an operating system, or a combination of one or more of them.

The processes and logic flows described in this specification can be performed by one or more computers or processors executing one or more computer programs to perform operations by operating on input data and generating output. The processes and logic flows can also be performed by special-purpose logic circuitry, e.g., an FPGA, an ASIC, or a GPU, or by a combination of special-purpose logic circuitry and one or more programmed computers.

Computers suitable for the execution of a computer program can be based on general or special-purpose microprocessors or both, or any other kind of central processing unit. Generally, a central processing unit will receive instructions and data from a read only memory or a random access memory or both. Elements of a computer can include a central processing unit for executing instructions and one or more memory devices for storing instructions and data. The central processing unit and the memory can be supplemented by, or incorporated in, special-purpose logic circuitry.

Generally, a computer will also include, or be operatively coupled to receive data from or transfer data to one or more storage devices. The storage devices can be, for example, magnetic, magneto optical, or optical disks, solid state drives, or any other type of non-transitory, computer-readable media. However, a computer need not have such devices. Thus, a computer may be coupled to one or more storage devices, such as, one or more memories, that are local and/or remote. For example, a computer can include one or more local memories that are integral components of the computer, or the computer can be coupled to one or more remote memories that are in a cloud network. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Components can be "coupled to" each other by being commutatively such as electrically or optically connected to one another, either directly or via one or more intermediate components. Components can also be "coupled to" each other if one of the components is integrated into the other. For example, a storage component that is integrated into a processor (e.g., an L2 cache component) is "coupled to" the processor.

To provide for interaction with a user, embodiments of the subject matter described in this specification can be implemented on, or configured to communicate with, a computer having a display device, e.g., an LCD (liquid crystal display) monitor, for displaying information to the user, and an input device by which the user can provide input to the computer, e.g., a keyboard and a pointing device, e.g., a mouse, a trackball or touchpad. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser, or by interacting with an app running on a user device, e.g., a smartphone or electronic tablet. Also, a computer can interact with a user by sending text messages or other forms of messages to a personal device, e.g., a smartphone that is running a messaging application, and receiving responsive messages from the user in return.

This specification uses the term "configured to" in connection with systems, apparatus, and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions. For special-purpose logic circuitry to be configured to perform particular operations or actions means that the circuitry has electronic logic that performs the operations or actions.

While this specification contains many specific embodiment details, these should not be construed as limitations on the scope of what is being claimed, which is defined by the claims themselves, but rather as descriptions of features that may be specific to particular embodiments. Certain features that are described in this specification in the context of separate embodiments can also be realized in combination in a single embodiment. Conversely, various features that are described in the context of a single embodiment can also be realized in multiple embodiments separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method for generating an action selection policy for causing an execution device to complete a task in an environment that includes the execution device and one or more other devices, the method comprising:

obtaining data representing a task that is divided into a sequence of subtasks, wherein:

the task comprises a task initial state, a plurality of non-task-terminal states, and a plurality of task terminal states, wherein each of the plurality of the task terminal states results from a sequence of actions taken by the execution device and by the one or more other devices in a subset of the plurality of non-task-terminal states, and the plurality of the task terminal states have respective rewards in the task terminal states, each subtask in the sequence of subtasks comprises one or more subtask initial states and a plurality of subtask terminal states of the subtask, and except for a last subtask in the sequence of subtasks, the plurality of subtask terminal states of the subtask are a plurality of subtask initial states of a next subtask that follows the subtask in the sequence of subtasks, for a specified subtask in the sequence of subtasks except for a first subtask in the sequence of subtasks, training a value neural network (VNN) for the specified subtask, wherein the VNN for the specified subtask receives inputs comprising reach probabilities of the execution device and the one or more other devices reaching a subtask initial state of the specified subtask, and predicts a reward of the execution device in the subtask initial state of the specified subtask; and training a strategy neural network (SNN) for a prior subtask that precedes the specified subtask in the sequence of subtasks based on the VNN for the specified subtask, wherein the SNN for the prior subtask receives inputs comprising a sequence of actions taken by the execution device and by the one or more other devices that reach a subtask state of the prior subtask, and predicts an action selection policy of the execution device in the subtask state of the prior subtask.

2. The method of claim 1, further comprising:
determining an action selection policy for completing the prior subtask based on an output generated by the SNN for the prior subtask; and
controlling operations of the execution device in the prior subtask according to the action selection policy for completing the prior subtask.

3. The method of claim 1, wherein training the VNN for the specified subtask comprises training the VNN for the specified subtask using an output from a VNN for a next subtask that follows the specified subtask in the sequence of subtasks, wherein the VNN for the next subtask receives inputs comprising reach probabilities of the execution device and the one or more other devices reaching a subtask initial state of the next subtask, and the output from the VNN for the next subtask comprises a reward of the execution device in the subtask initial state of the next subtask.

4. The method of claim 1, wherein training a value neural network (VNN) for the specified subtask comprises:
obtaining a plurality of sample inputs to the VNN for the specified subtask, wherein each of the plurality of sample inputs comprises:
public information of the execution device and the one or more other devices reaching the subtask initial state of the specified subtask;
the reach probabilities of the execution device and the one or more other devices reaching the subtask initial state of the specified subtask;
for the each of the plurality of sample inputs, calculating a sample reward of the execution device in the subtask initial state of the specified subtask by performing a counterfactual regret minimization (CFR) algorithm; and
training the VNN for the specified subtask based on the each of the plurality of sample inputs and the sample reward of the execution device in the subtask initial state of the specified subtask.

5. The method of claim 1, wherein training the SNN for the prior subtask based on the VNN for the specified subtask comprises:
predicting a plurality of rewards in the plurality of subtask terminal states of the prior subtask based on an output of the VNN for the specified subtask; and
training the SNN for the prior subtask based on the plurality of rewards in the plurality of subtask terminal states of the prior subtask according to a neural-network-based CFR algorithm.

6. The method of claim 1, further comprising:
training another strategy neural network (SNN) for another subtask in the sequence of subtasks based on a VNN for a subtask that follows the another subtask in the sequence of subtasks, wherein the training the another SNN for the another subtask is performed independently from the training the SNN for the prior subtask.

7. The method of claim 1, wherein training the SNN for the prior subtask based on the VNN for the specified subtask is performed in response to determining that a complexity of the prior subtask exceeds a threshold.

8. A computer-implemented system for generating an action selection policy causing an execution device to complete a task in an environment that includes the execution device and one or more other devices, the computer-implemented system comprising:
one or more processors; and
one or more computer-readable memories coupled to the one or more processors and having instructions stored thereon that are executable by the one or more processors to perform operations comprising:
obtaining data representing a task that is divided into a sequence of subtasks, wherein:
the task comprises a task initial state, a plurality of non-task-terminal states, and a plurality of task terminal states, wherein each of the plurality of the task terminal states results from a sequence of actions taken by the execution device and by the one or more other devices in a subset of the plurality of non-task-terminal states, and the plurality of the task terminal states have respective rewards in the task terminal states,
each subtask in the sequence of subtasks comprises one or more subtask initial states and a plurality of subtask terminal states of the subtask, and
except for a last subtask in the sequence of subtasks, the plurality of subtask terminal states of the subtask are a plurality of subtask initial states of a next subtask that follows the subtask in the sequence of subtasks,
for a specified subtask in the sequence of subtasks except for a first subtask in the sequence of subtasks,
training a value neural network (VNN) for the specified subtask, wherein the VNN for the specified subtask receives inputs comprising reach probabilities of the execution device and the one or more other devices reaching a subtask initial state of the specified subtask, and predicts a reward of the execution device in the subtask initial state of the specified subtask; and
training a strategy neural network (SNN) for a prior subtask that precedes the specified subtask in the sequence of subtasks based on the VNN for the specified subtask, wherein the SNN for the prior subtask receives inputs comprising a sequence of actions taken by the execution device and by the one or more other devices that reach a subtask state of the prior subtask, and predicts an action selection policy of the execution device in the subtask state of the prior subtask.

9. The computer-implemented system of claim 8, wherein the operations further comprise:
determining an action selection policy for completing the prior subtask based on an output generated by the SNN for the prior subtask; and
controlling actions of the execution device in the prior subtask according to the action selection policy for completing the prior subtask.

10. The computer-implemented system of claim 8, wherein training the VNN for the specified subtask comprises training the VNN for the specified subtask using an output from a VNN for a next subtask that follows the specified subtask in the sequence of subtasks, wherein the VNN for the next subtask receives inputs comprising reach probabilities of the execution device and the one or more other devices reaching a subtask initial state of the next subtask, and the output from the VNN for the next subtask comprises a reward of the execution device in the subtask initial state of the next subtask.

11. The computer-implemented system of claim 8, wherein training a value neural network (VNN) for the specified subtask comprises:
    obtaining a plurality of sample inputs to the VNN for the specified subtask, wherein each of the plurality of sample inputs comprises:
        public information of the execution device and the one or more other devices reaching the subtask initial state of the specified subtask;
        the reach probabilities of the execution device and the one or more other devices reaching the subtask initial state of the specified subtask;
    for the each of the plurality of sample inputs, calculating a sample reward of the execution device in the subtask initial state of the specified subtask by performing a counterfactual regret minimization (CFR) algorithm; and
    training the VNN for the specified subtask based on the each of the plurality of sample inputs and the sample reward of the execution device in the subtask initial state of the specified subtask.

12. The computer-implemented system of claim 8, wherein training the SNN for the prior subtask based on the VNN for the specified subtask comprises:
    predicting a plurality of rewards in the plurality of subtask terminal states of the prior subtask based on an output of the VNN for the specified subtask; and
    training the SNN for the prior subtask based on the plurality of rewards in the plurality of subtask terminal states of the prior subtask according to a neural-network-based CFR algorithm.

13. The computer-implemented system of claim 8, wherein the operations further comprise:
    training another strategy neural network (SNN) for another subtask in the sequence of subtasks based on a VNN for a subtask that follows the another subtask in the sequence of subtasks, wherein the training the another SNN for the another subtask is performed independently from the training the SNN for the prior subtask.

14. The computer-implemented system of claim 8, wherein training the SNN for the prior subtask based on the VNN for the specified subtask is performed in response to determining that a complexity of the prior subtask exceeds a threshold.

15. A non-transitory, computer-readable medium storing one or more instructions executable by a computer system to perform operations for generating an action selection policy causing an execution device to complete a task in an environment that includes the execution device and one or more other devices, the operations comprising:
    obtaining data representing a task that is divided into a sequence of subtasks, wherein:
        the task comprises a task initial state, a plurality of non-task-terminal states, and a plurality of task terminal states, wherein each of the plurality of the task terminal states results from a sequence of actions taken by the execution device and by the one or more other devices in a subset of the plurality of non-task-terminal states, and the plurality of the task terminal states have respective rewards in the task terminal states,
        each subtask in the sequence of subtasks comprises one or more subtask initial states and a plurality of subtask terminal states of the subtask, and
        except for a last subtask in the sequence of subtasks, the plurality of subtask terminal states of the subtask are a plurality of subtask initial states of a next subtask that follows the subtask in the sequence of subtasks,
    for a specified subtask in the sequence of subtasks except for a first subtask in the sequence of subtasks,
        training a value neural network (VNN) for the specified subtask, wherein the VNN for the specified subtask receives inputs comprising reach probabilities of the execution device and the one or more other devices reaching a subtask initial state of the specified subtask, and predicts a reward of the execution device in the subtask initial state of the specified subtask; and
        training a strategy neural network (SNN) for a prior subtask that precedes the specified subtask in the sequence of subtasks based on the VNN for the specified subtask, wherein the SNN for the prior subtask receives inputs comprising a sequence of actions taken by the execution device and by the one or more other devices that reach a subtask state of the prior subtask, and predicts an action selection policy of the execution device in the subtask state of the prior subtask.

16. The non-transitory, computer-readable medium of claim 15, wherein the operations further comprise:
    determining an action selection policy for completing the prior subtask based on an output generated by the SNN for the prior subtask; and
    controlling actions of the execution device in the prior subtask according to the action selection policy for completing the prior subtask.

17. The non-transitory, computer-readable medium of claim 15, wherein training the VNN for the specified subtask comprises training the VNN for the specified subtask using an output from a VNN for a next subtask that follows the specified subtask in the sequence of subtasks, wherein the VNN for the next subtask receives inputs comprising reach probabilities of the execution device and the one or more other devices reaching a subtask initial state of the next subtask, and the output from the VNN for the next subtask comprises a reward of the execution device in the subtask initial state of the next subtask.

18. The non-transitory, computer-readable medium of claim 15, wherein training a value neural network (VNN) for the specified subtask comprises:
    obtaining a plurality of sample inputs to the VNN for the specified subtask, wherein each of the plurality of sample inputs comprises:
        public information of the execution device and the one or more other devices reaching the subtask initial state of the specified subtask;
        the reach probabilities of the execution device and the one or more other devices reaching the subtask initial state of the specified subtask;
    for the each of the plurality of sample inputs, calculating a sample reward of the execution device in the subtask initial state of the specified subtask by performing a counterfactual regret minimization (CFR) algorithm; and training the VNN for the specified subtask based on the each of the plurality of sample inputs and the sample reward of the execution device in the subtask initial state of the specified subtask.

19. The non-transitory, computer-readable medium of claim 15, wherein training the SNN for the prior subtask based on the VNN for the specified subtask comprises:
predicting a plurality of rewards in the plurality of subtask terminal states of the prior subtask based on an output of the VNN for the specified subtask; and
training the SNN for the prior subtask based on the plurality of rewards in the plurality of subtask terminal states of the prior subtask according to a neural-network-based CFR algorithm.

20. The non-transitory, computer-readable medium of claim 15, wherein the operations further comprise:
training another strategy neural network (SNN) for another subtask in the sequence of subtasks based on a VNN for a subtask that follows the another subtask in the sequence of subtasks, wherein the training the another SNN for the another subtask is performed independently from the training the SNN for the prior subtask; and
wherein training the SNN for the prior subtask based on the VNN for the specified subtask is performed in response to determining that a complexity of the prior subtask exceeds a threshold.

* * * * *